United States Patent [19]

Kwon et al.

[11] Patent Number: 5,955,857
[45] Date of Patent: Sep. 21, 1999

[54] WAFER CONVEYOR SYSTEM

[75] Inventors: Chang-Heon Kwon; Ki-Ho Lee, both of Kyoungki-do; Hae-San Ryoo, Seoul; Yong-Pyo Kim, Kyoungki-do, all of Rep. of Korea

[73] Assignee: Hyundai Electronics Industries Co., Ltd., Kyoungki-do, Rep. of Korea

[21] Appl. No.: 08/698,268

[22] Filed: Aug. 14, 1996

[30] Foreign Application Priority Data

Aug. 14, 1995 [KR] Rep. of Korea ................ 95-24930

[51] Int. Cl.⁶ .................. G06F 13/00; G06F 15/50
[52] U.S. Cl. .............. 318/568.11; 318/640; 364/424.02; 414/786
[58] Field of Search ................ 318/560–696, 318/138, 139; 901/1, 3; 414/786, 273, 331, 940, 222, 939, 935, 217, 280, 282; 364/478.06, 478.03, 468.28, 424.02, 424.03; 395/650; 180/168, 169

[56] References Cited

U.S. PATENT DOCUMENTS

| | | |
|---|---|---|
| 3,973,685 | 8/1976 | Loomer ................ 214/16 B |
| 4,056,201 | 11/1977 | Giros ................ 214/16.4 |
| 4,091,737 | 5/1978 | Giros ................ 104/242 |
| 4,218,616 | 8/1980 | Loomer ................ 250/223 R |
| 4,328,422 | 5/1982 | Loomer ................ 250/239 |
| 4,886,412 | 12/1989 | Wooding et al. ................ 414/416 |
| 4,987,834 | 1/1991 | Peck, Jr. et al. ................ 104/300 |
| 5,003,417 | 3/1991 | Grant ................ 414/280 |
| 5,015,139 | 5/1991 | Baur ................ 414/281 |
| 5,023,790 | 6/1991 | Luke, Jr. ................ 364/424.02 |
| 5,049,023 | 9/1991 | Knyazkin et al. ................ 414/280 |
| 5,075,853 | 12/1991 | Luke, Jr. ................ 364/424.02 |
| 5,202,716 | 4/1993 | Tateyama et al. ................ 354/319 |
| 5,320,218 | 6/1994 | Yamashita et al. ................ 206/213.1 |
| 5,367,456 | 11/1994 | Summerville et al. ................ 364/424.02 |
| 5,419,058 | 5/1995 | Swain et al. ................ 34/186 |
| 5,460,476 | 10/1995 | Gazza ................ 414/786 |
| 5,536,128 | 7/1996 | Shimoyashiro et al. ................ 414/273 |
| 5,546,315 | 8/1996 | Kleinschnitz ................ 364/478.06 |
| 5,551,830 | 9/1996 | Watanabe et al. ................ 414/786 |

*Primary Examiner*—Paul Ip
*Attorney, Agent, or Firm*—Ware, Fressola, Van Der Sluys & Adolphson LLP

[57] ABSTRACT

A wafer conveyor system and controlling method therefor sends/receives a semiconductor wafer to/from a designated place includes a stocker for storing and delivering a package box with a plurality of wafers therein, a transferring path for connecting one stocker with another stocker, a carrier traveling along the transferring path for transporting the package box between the stockers, an automatic charging device placed to any one position of the transferring path for charging a battery loaded onto the carrier traveling along the transferring path when the battery is discharged, and a central control unit for controlling the driving of the stocker, transferring path, carrier and automatic charging device.

44 Claims, 25 Drawing Sheets

FIG.22A
FIG.22C
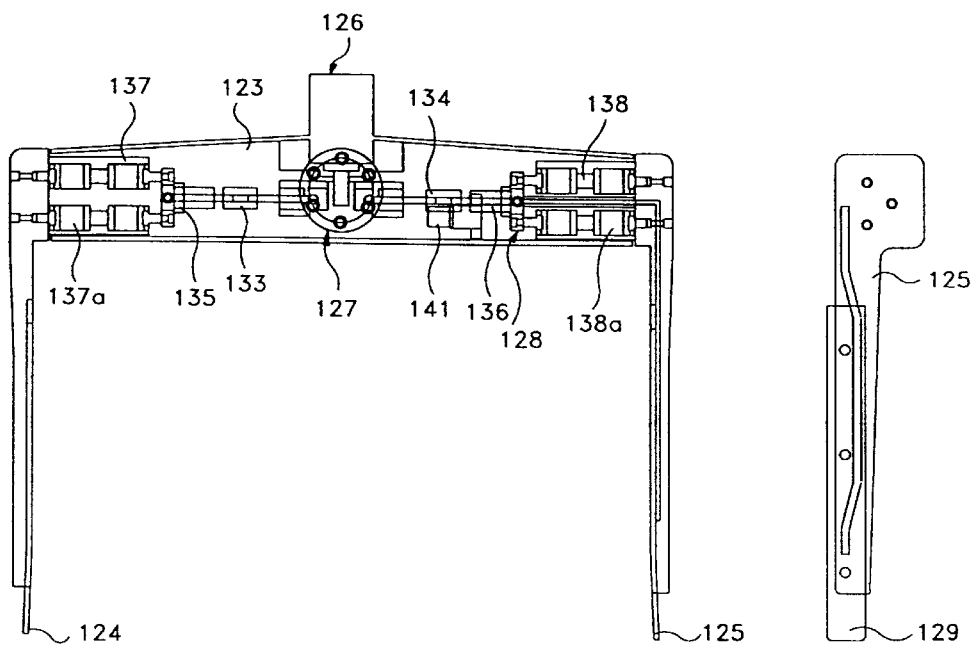
FIG.22B
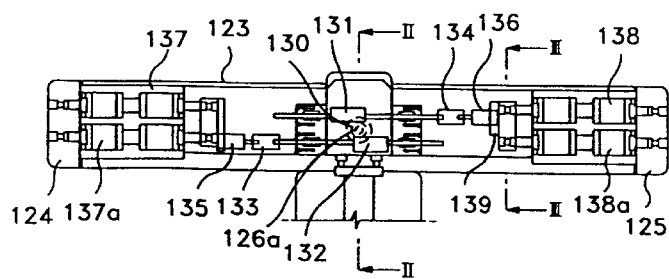

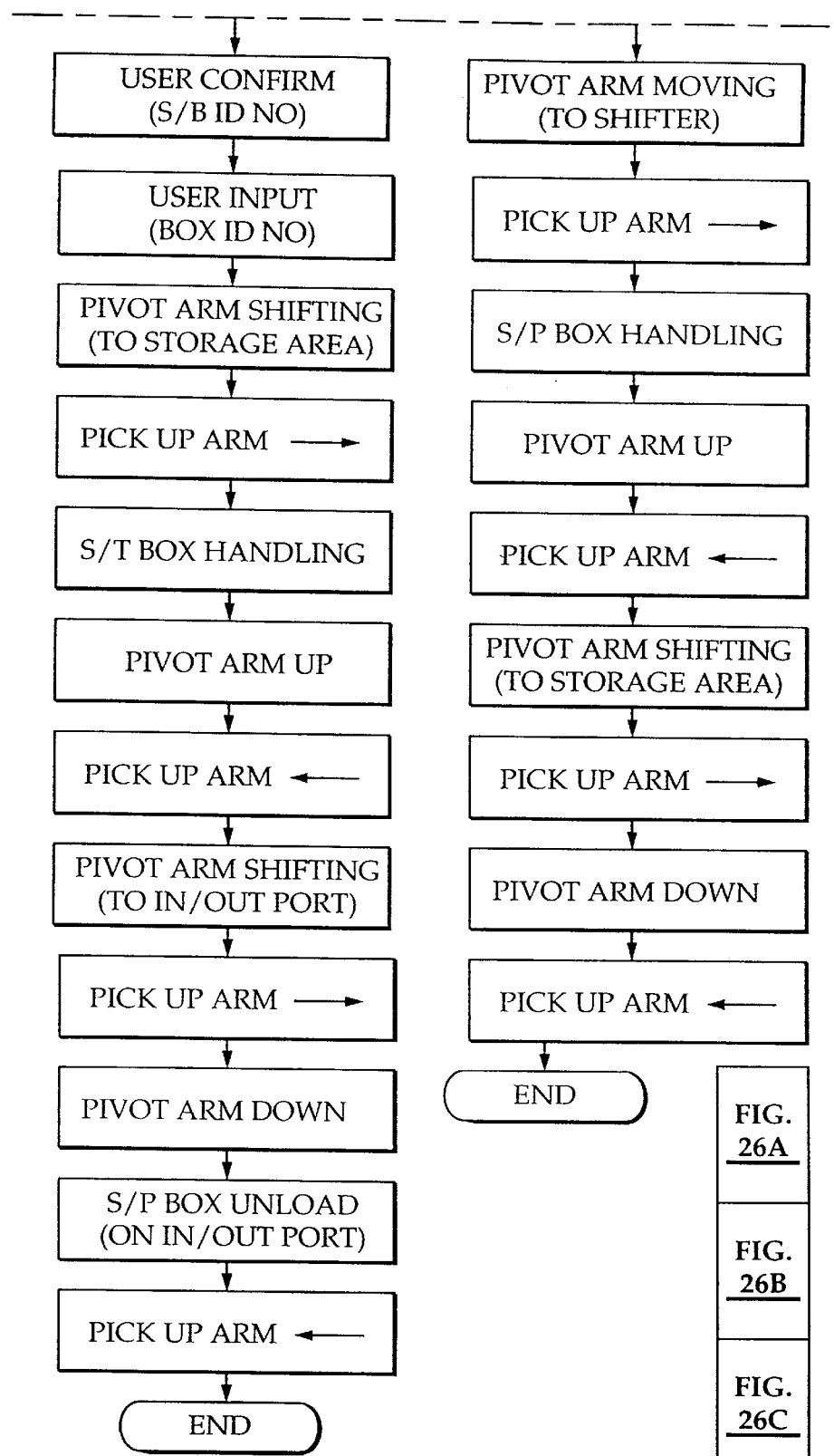

WAFER CONVEYOR SYSTEM

FIELD OF THE INVENTION

The present invention relates to a system for sending or receiving a semiconductor wafer to/from a designated place to be employed for rapid delivery system and, more particularly, to a wafer conveyor system and a controlling method thereof capable of being utilized as an apparatus for transporting and storing wafers as well as other goods.

PRIOR ART

A wafer manufacturing is generally subjected to a process of repeated etching and depositing steps. During the process, the wafer being produced must be transported to the operating position for each of the respective steps.

A system for delivering the wafer to the operating position of respective steps is in a stage of being developed from a floor conveyor system to a plus ceiling conveyor system. Currently, several foreign companies have developed a plus ceiling conveyor system and put it into practical use.

However, the above-mentioned conventional plus ceiling conveyor system has the following shortcomings.

First, the wafer must be manually loaded repeatedly, demanding time consuming labor. Second, the decrease of a carrier speed caused by a curved process line lowers effectiveness. Third, the system requires a wide installation space to impeding the delivery of other apparatuses.

In addition, the conventional conveyor system involves complicated maintenance, worker's safety and troublesome working operation due to a manual replacement of a battery. Accordingly, solving these problems are of vital interest.

SUMMARY

Therefore, it is an object of the present invention to provide a wafer conveyor system and controlling method therefof capable of fully automating the manual delivery of a wafer for respective steps heretofore, managing overall conveyor system to quickly and accurately transfer the wafer, and increase management efficiency of the overall conveyor system.

It is another object of the present invention to provide a wafer conveyor system for minimizing a rotation radius of a carrier, reducing the amount of occupied space and simplifying the system's structure.

It is still another object of the present invention to provide a wafer conveyor system having more various functions such as information communication function, self-charging up function of a battery, frontal obstacle sensing function and wafer storage box sensing function. In addition, there is provided the capacity for reducing power consumption.

To achieve the above objects of the present invention, a wafer conveyor system includes a stocker for storing and delivering a package box with a plurality of wafers therein, and a transferring path for connecting one stocker with another stocker. In addition, a carrier traveling along the transferring path transports the package box between the stockers, and an automatic charging device is placed at any one position of the transferring path for charging a battery loaded onto the carrier traveling along the transferring path when the battery is discharged. There is also provided a central control unit that controls the driving of the stocker, transferring path, carrier and automatic charging device.

Furthermore, a method for controlling a wafer conveyor system according to the present invention is carried out by selecting a transporting process of the package box via a user interface of a central control unit, picking up a corresponding package box stored in a storage zone of a stocker in accordance with the transporting process during an output process, and putting the package box on the carrier, and storing the package box transported from another stocker to corresponding storage zone during an input process. Next, the carrier loaded with the package box is transported to a load/unload position, and the package box on the carrier is picked up and stored in the corresponding storage zone.

The wafer conveyor system according to the present invention as provided above is constructed such that the main rail of the transferring path is installed to a ceiling of an assembly hall, and a plurality of carriers are put on the transferring path to travel along thereon. Furthermore, the stocker for delivering and storing of the products between respective processes is connected to the transferring path to fully automate the product transportation by means of a computer control, thereby remarkably decreasing the labor time needed for product delivery that was before manually executed. Additionally, the charging of the battery which has been manually replaced is carried out automatically. Moreover, the above-described circumstances are handled by a main computer to enable extensive information processing with respect to areas such as the delivery of the products, proceeding phases of the system, and diagnosis of the facility.

BRIEF DESCRIPTION OF THE DRAWINGS

The above objects and other advantages of the present invention will become more apparent by describing in detail preferred embodiments thereof with reference to the following detailed description, appended claims and attached drawings wherein:

FIGS. 22A, 22B and 22C are a plan view, a front view and a side view, respectively, showing the structure of the pickup arm;

FIG. 26 shows the relation between FIGS. 26A, 26B and 26C; and FIGS. 26A, 26B and 26C together comprise a flow chart showing an operation of the wafer conveyer system according to the present invention.

DETAILED DESCRIPTION OF THE PREFERRED EMBODIMENTS

Figure 1:
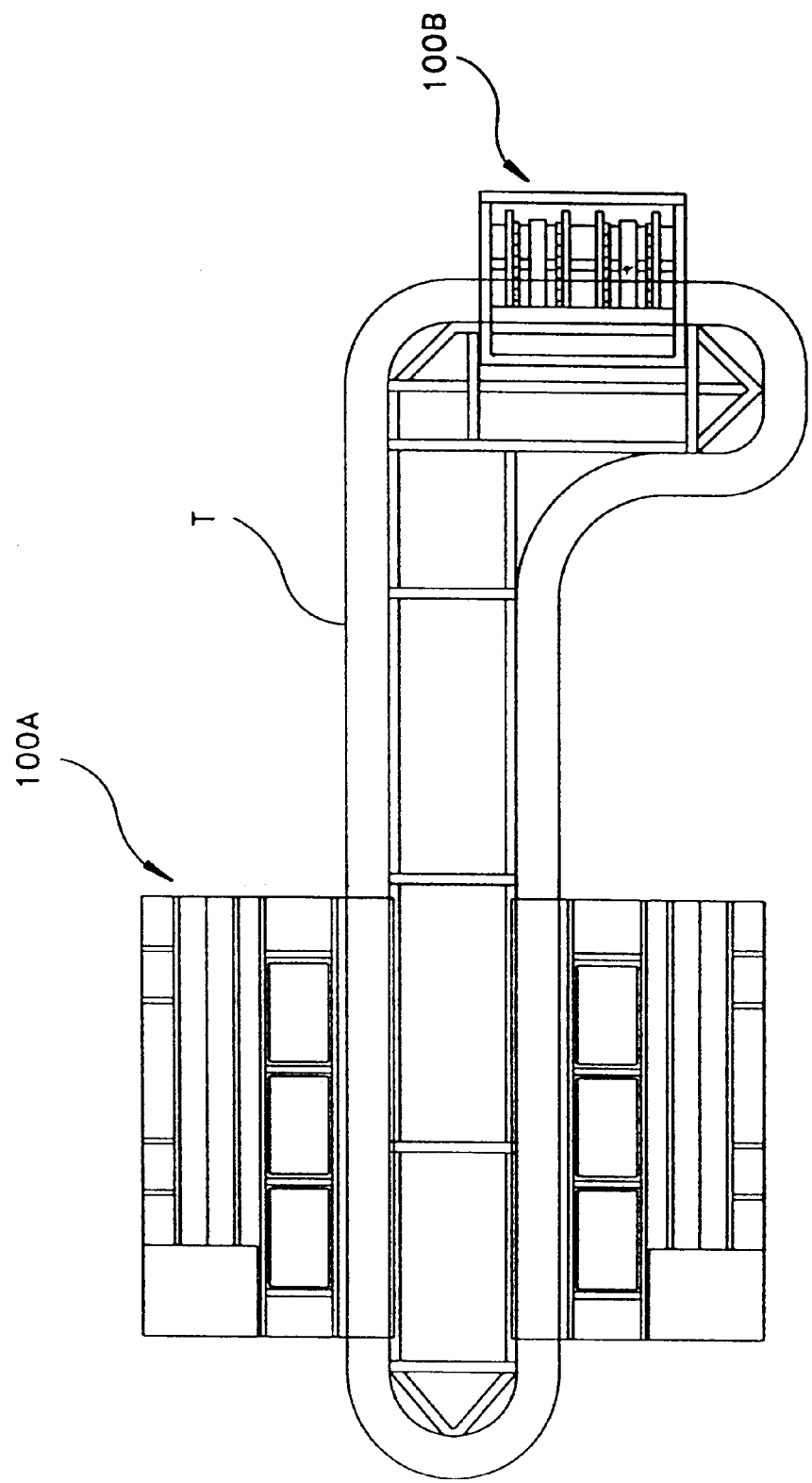
FIG. 1 is a schematic construction view showing a wafer conveyor system according to an embodiment of present invention.

In FIG. 1, a number of stockers 100A stored with package boxes 100D for packing wafers in respective process lines to deliver them are connected by a main rail T which is constructed to have a transferring path of a closed line. The package boxes 100D are transported to the respective stockers 100A by means of a carrier 100C (refer to FIG. 2) traveling along the main rail T. The carrier 100C is driven by a motor actuated by electric power from a battery 100E (refer to FIG. 2). An automatic charging device 100B for charging the battery when needed is provided to one side of main rail T. The stocker 100A, main rail T, carrier 100C and automatic charging device 100B are controlled by a central control unit.

Figure 2:
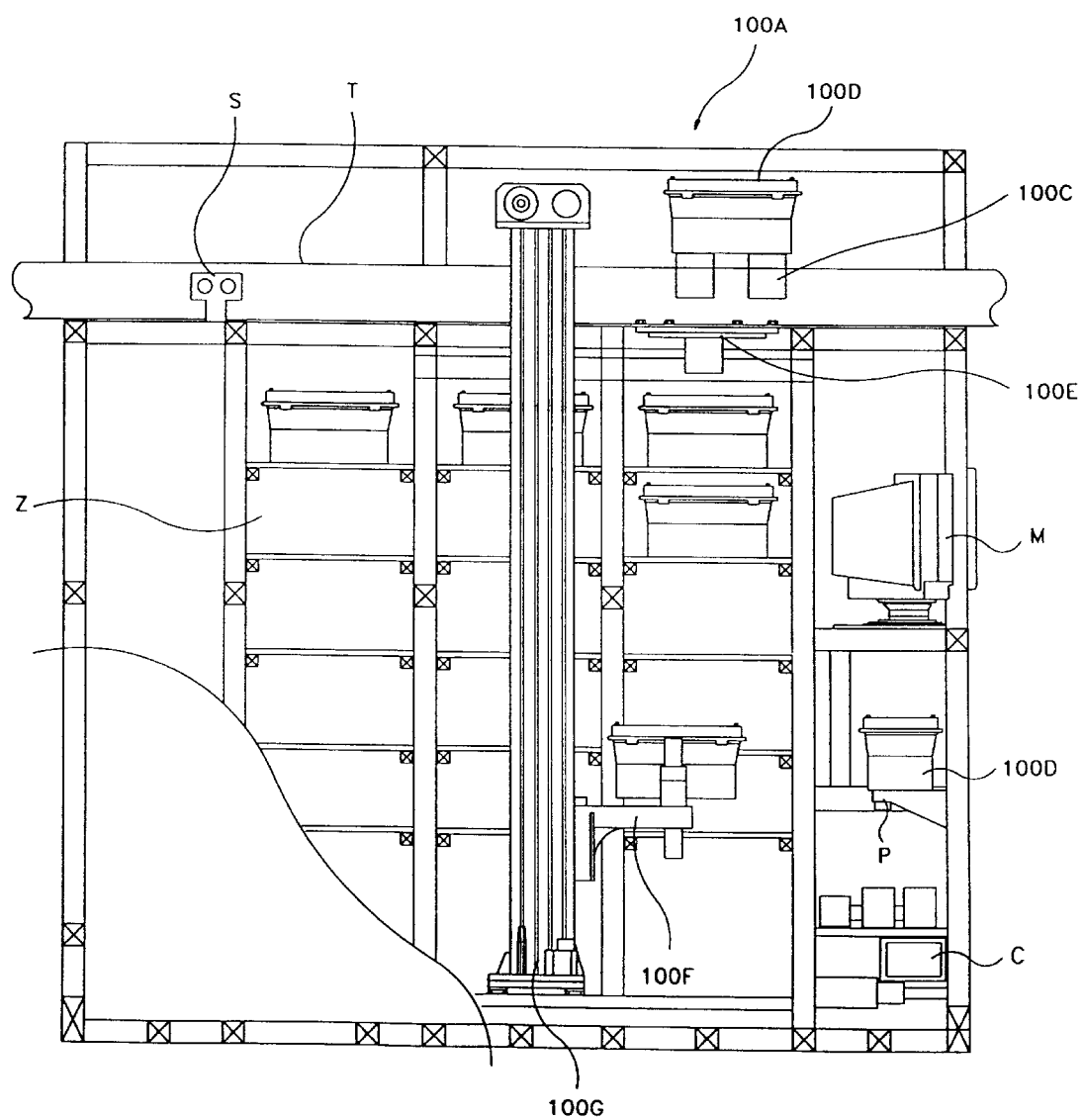
FIG. 2 is a side view showing a structure of the stocker according to an embodiment of the present invention.

FIG. 2 is a side view showing a structure of the stocker. In the stocker, there are a rail branch apparatus, a battery charging apparatus, a stopping device and a transporting device. The rail branch apparatus separates the carrier 100C from the main rail T. The battery charging apparatus supply the electric power to the carrier 100C. The stopping device 5 transmits a stop signal to the carrier 100C. The transporting device consists of a pivot arm unit 100F and a pivot arm lifter 100G and delivers the package boxes 100D between the carrier 100C and the storing zones Z.

In addition, stocker 100A includes a storing section, an information managing section and a controlling section. The storing section has a plurality of storing zones Z for storing the package boxes 100D. The information managing section monitors information of stocker 100A and the controlling section C controls the operation of stocker 100A. The information managing section is formed by an input/output port P (hereinafter referred to as "I/O port") for supplying information of the package box 100D to controlling the section C or outputting the information via an output section, and a terminal M connected to the I/O port P and the section C by an user interface for monitoring the information. Here, terminal M corresponds to an output unit.

The movement of carrier 100C along the main rail T for carrying in/out the wafer to/from respective stockers 100A will be described with reference to FIGS. 3 to 10.

Figure 3:
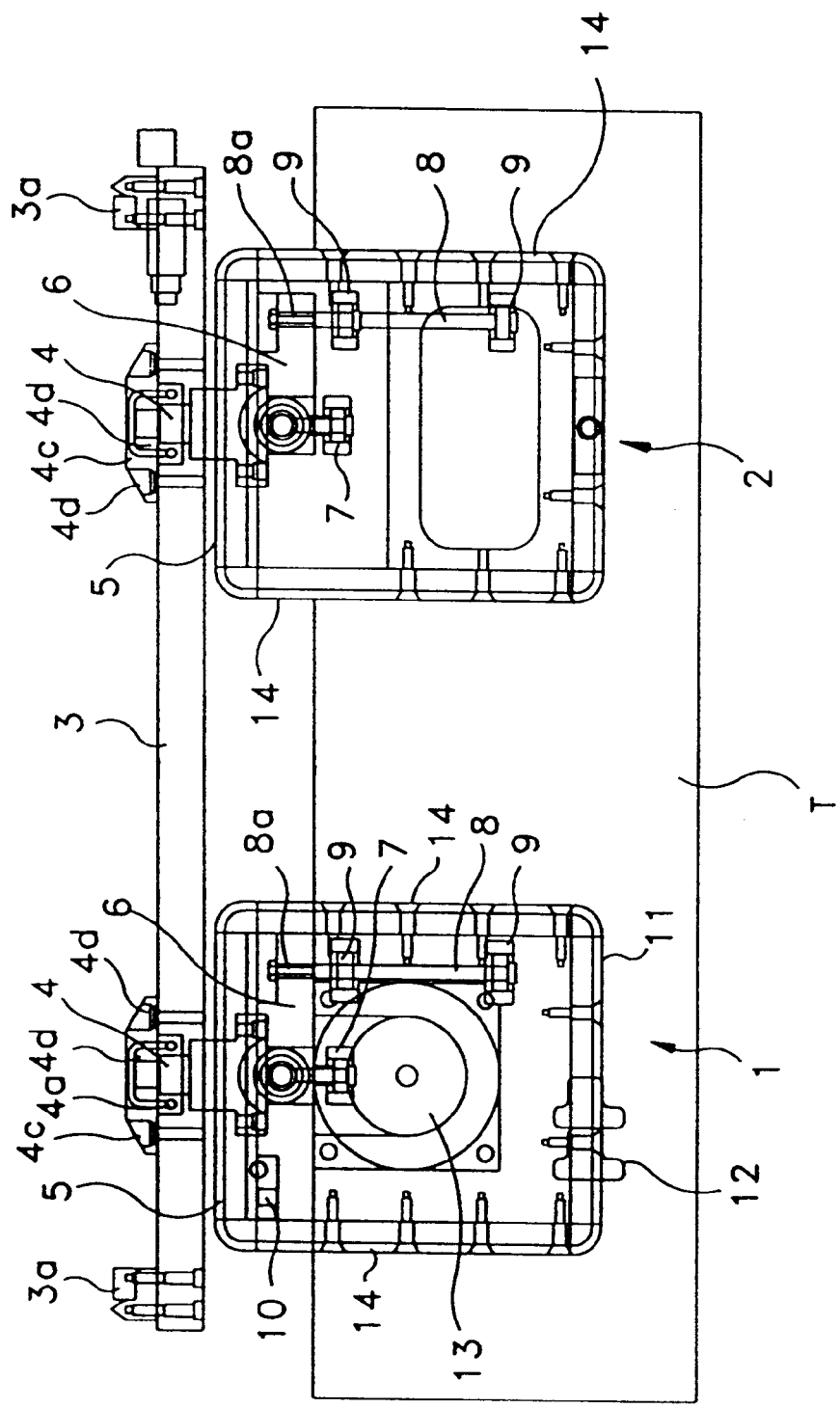
FIG. 3 is a front view showing an overall structure of the carrier.

As shown in FIG. 3, the carrier 100C comprises a driving section 1 and a charging section 2. A table 3 for mounting the package box 100D is installed to the upper portion of the driving section 1 and the charging section 2. The table 3 is provided with separation preventing ends 3a at respective corners. In addition, the table 3 is formed with shaft holes corresponding to the respective centers of the driving section 1 and the charging section 2. Rotation guide shafts 4 pierce through the shaft holes formed in table 3 and the shaft holes formed in upper plates 5 of driving section 1 and charging section 2.

The upper end of rotation guide shaft 4 is fixed by means of an angular bearing 4a which is fixed to the table 3 by means of a bearing nut 4b screw-coupled. External exposure of the bearing nut 4b is prevented means of a bearing cap 4c which is fixed to table 3 by a plurality of bolts 4d. The lower end of rotation guide shaft 4 is formed with a flange having a diameter larger than the shaft hole in the upper plate 5, so that driving section 1 and charging section 2 are hung from rotation guide shafts 4 and are thus idle.

Furthermore, the driving section 1 and charging section 2 of carrier 100C are respectively installed with guide roller brackets 6 extending to one sides to be connected to the flanges at the upper plates 5. Balance-keeping rollers 7, driven along main rail T for preventing lateral shaking of the driving section 1 and charging section 2 when carrier 100C is transferred along main rail T, is installed to the central lower ends of guide roller brackets 6. Downward-extending roller shafts 8 are fixed to the right lower ends of guide roller brackets 6 via bolts 8a, and guide rollers 9 driven along main rail T are installed to the upper and lower ends of the roller shafts 8 so as to prevent the package boxes 100D from dropping due to the jolting of the table 3, fixed to the driving and charging sections 1 & 2, loaded with package boxes 100D thereon when driving section 1 and charging section 2 of the carrier advance to the curved path of main rail T.

Driving section 1 is driven by a first motor 13 installed to the center of driving section 1. A photosensor 10 is furnished to the left upper portion of the driving section 1 to sense a frontal obstruction when carrier 100C travels along main rail T. A low-speed, high-speed and stop operations of the driving section 1 are sensed by three position sensors 12 installed to the lower plate 11 of the driving section 1.

Figure 4:
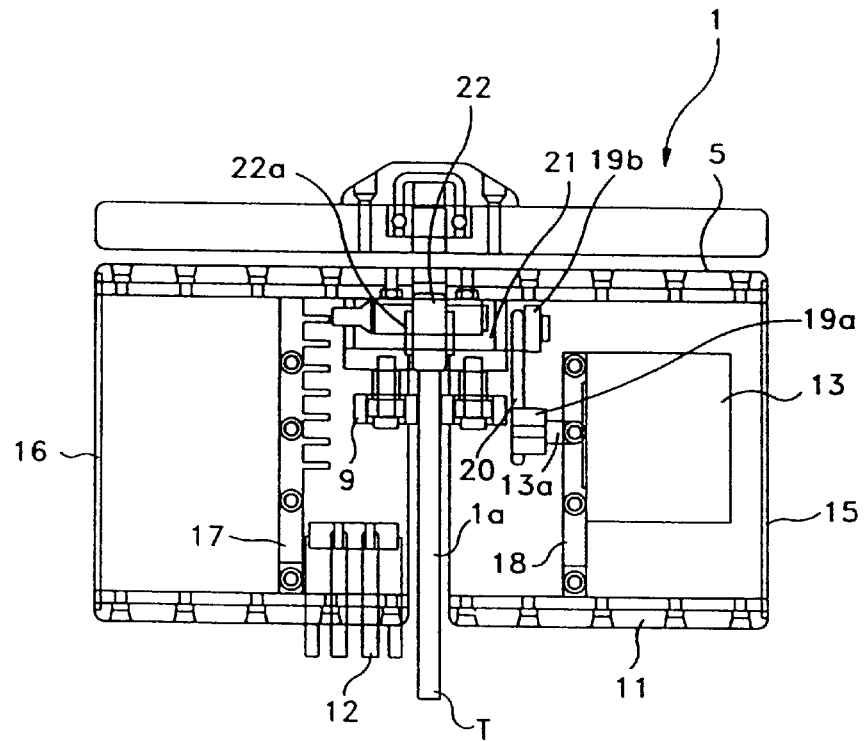
FIG. 4 is a left side view showing the carrier driving section.
Figure 5:
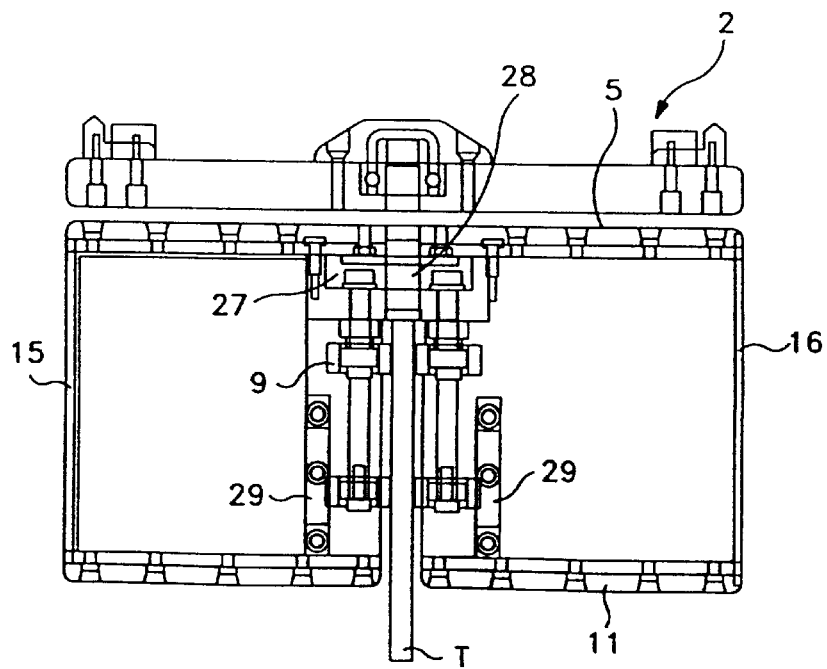
FIG. 5 is a right side view showing the carrier charging section.

Shown in FIGS. 3 and 4, the driving section 1 and charging section 2 shaped as a hexahedron have upper plates 5 constituting the upper portion, bottom plates 11 constituting the lower portion, side plates 14 constituting the right and left planes, respectively, front plates 15 constituting the front plane and rear plates 16 constituting the rear plane. The driving section 1 and charging section 2 are separated into two portions of right and left connected by table 3, and the main rail T is located in a space 1a between the right and left sides. In driving section 1, a first plate 17 is fixed to both side plates 14 across upper plate 5 and bottom plate 11 is installed to the left center of driving section 1. The first plate 17 internally has a board (not shown) for storing information about the package boxes 100D loaded on table 3 or about moving position of carrier 100C.

The first motor 13 is supported by a plate 18 installed at the center of the right side of the driving section 1. A first pulley 19*a* is joined with a motor shaft 13*a* of the first motor 13. The motive power produced from first motor 13 is transmitted to a second pulley 19*b* joined to a main roller shaft 21 via a chain 20 installed to the first pulley 19*a*. The main roller shaft 21 is fixed to upper plate 5 via a bolt 21*a*, and a main roller 22 is installed to main roller shaft 21 via a bearing 22*a* for achieving smooth rotation.

A step motor is preferably used for the first motor 13 to achieve the accuracy having a degree of error of ±0.1mm necessary in positioning the carrier 100C at a desired feeding position.

Figure 6:
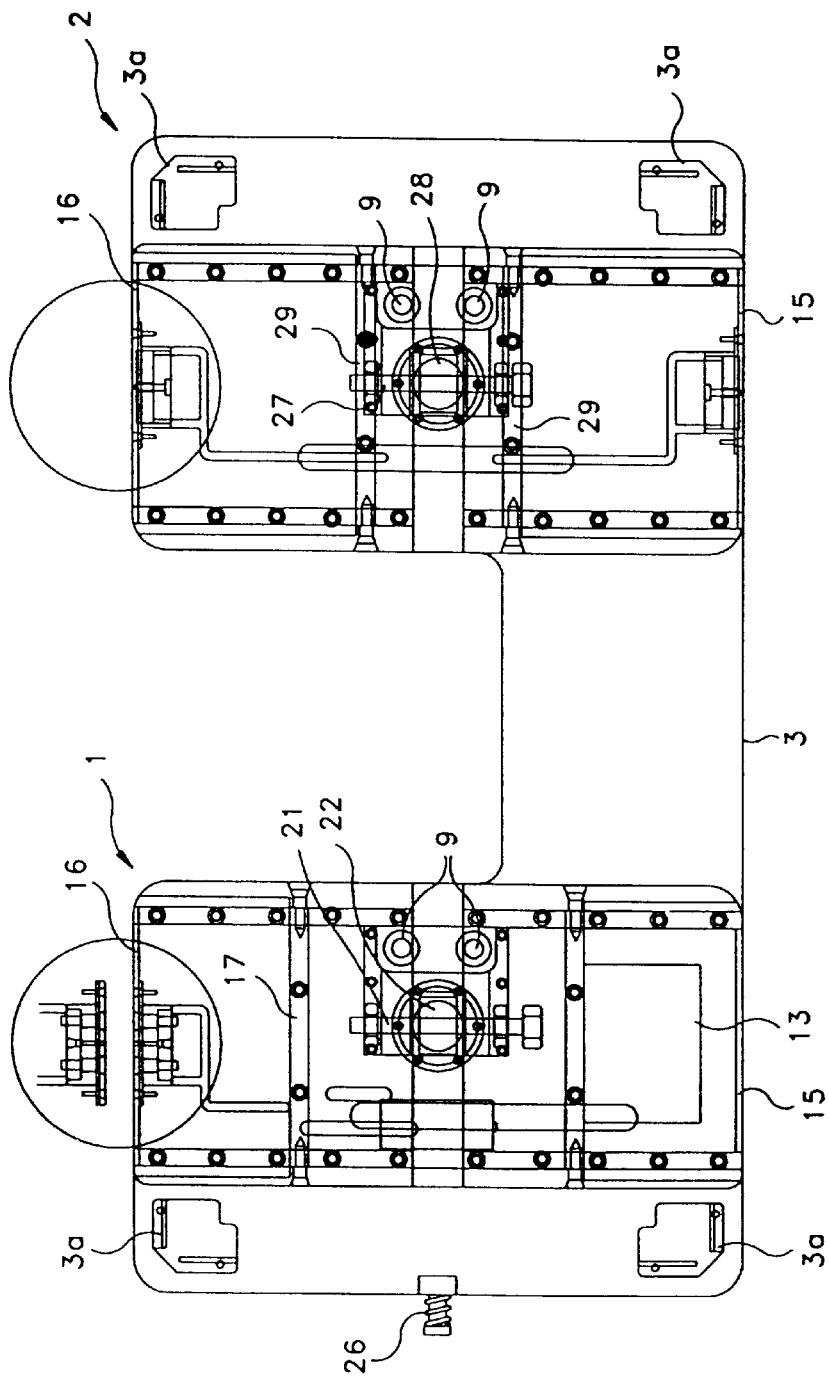
FIG. 6 is a plan view showing the carrier.

Referring to FIG. 6, which more specifically illustrates the position of respective elements of the driving section 1, a first plate 17 is installed at the center of the upper section of the driving section 1, and a first motor supporting plate 18 is installed at the center of the buttom center thereof. As described above, the main roller 22 and main roller shaft 21 are installed in the center of the driving section 1.

An infrared ray emitting device provides a line of communicating for the information stored in the board within terminal M and is installed to rear plate 16, which is connected to the board via a cable. The board is furnished with a charge inspecting device (not shown) which inspects a charging amount of the battery and charges the battery by means of the electric power supplied from a power supply apparatus once the charging amount of the battery is lowered.

Figure 7:
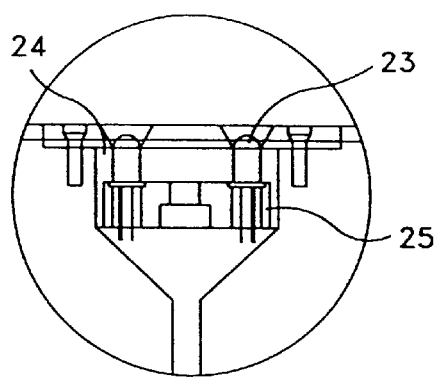
FIG. 7 is a detailed view showing an infrared ray emitting device installed to the carrier.

As shown in FIG. 7, infrared ray emitting device 23 connected to the board by means of the cable is supported by an infrared ray emitter holder 24, which is connected to a terminal connecting port via an infrared ray generator pusher 25. The infrared ray emitter holder is outwardly projected for transmitting the information to the terminal M by via the infrared rays.

As shown in FIG. 6, the charging section 2 is installed such that an auxiliary roller shaft 27 is fixed to the center of upper plate 5, and an auxiliary roller 28 is installed to auxiliary shaft 27. A second plate 29 containing the battery therein is then placed onto both sides of main rail T and on the bottom plate 11 and both side plates 14. This driving section 1 is equipped with a bumper 26 at the left center thereof for alleviating an impact caused by a collision should the driving section 1 collide with an obstruction while traveling along main rail T. The charging section 2 includes two second plates 29 fixed to the bottom plate 11 and to both side plates 14. Each of the second plate 29 includes the battery (not shown) for storing the electric power to continuously provide the electric power to first motor 13 of driving section 1.

Figure 8:
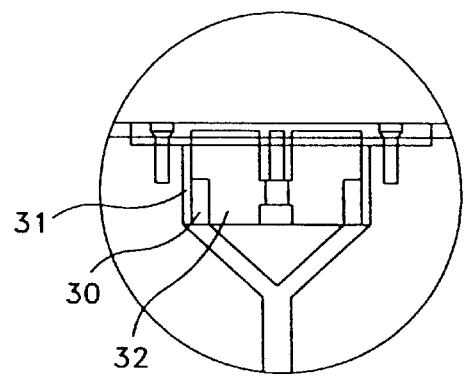
FIG. 8 is a detailed view showing a connector device installed to the carrier.

Referring to FIG. 8, a connector device has a connector 30 for connecting the battery to the power supply apparatus, a charging connector 31 for temporarily storing the electric power and a connector pusher 32 projecting the connect 30 outwardly. Once the charge amount of the battery decreases and is detected by the charging inspecting function incorporated into the board, the connector device is automatically connected to the power supply apparatus to charge the battery.

Figure 9:
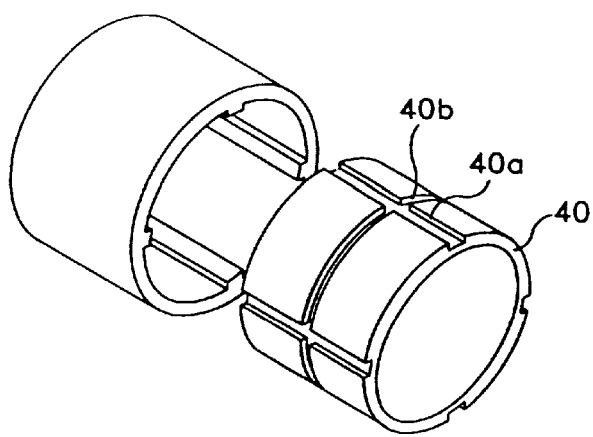
FIG. 9 is an exploded perspective view showing a roller installed to the carrier.

Referring to FIG. 9 which is an exploded perspective view schematically showing the roller installed in the carrier. At the roller wheel 40, grooves 40*a* and 40*b* are formed in the vertical and radial directions to be joined with the roller by coupling the vertically-projecting portion formed at the inner surface of the roller into vertical groove 40*a* of roller wheel 40. Therefore, while the roller travels along main rail T, wheel 40 and the roller come into close contact with each other to prevent the deviation of the roller from wheel 40. The roller is preferably formed of a silicon which, is tolerant from chemicals and resistant to abrasion.

The rotation radius of carrier 100C is determined by the central distance between the driving section 1 and charging section 2. When the central distance between driving section 1 and charging section 2 is too long, the rotation radius of carrier 100C is greatly enlarged. On the other hand, if the central distance between the driving section 1 and charging section 2 is too short, the rotation radius of carrier 100C is reduced and an area of table 3 loaded with package boxes 100D is decreased to degrade transportation capacity. Also, carrier 100C is severely shaken during its rotation so its stability is not maintained. Thus, the central distance between driving section 1 and charging section 2 needs to be properly selected.

The central distance between driving section 1 and charging section 2 is determined by setting between a curvature at a certain point of the curved rail and the advancing direction of carrier 100C.

Figure 10:
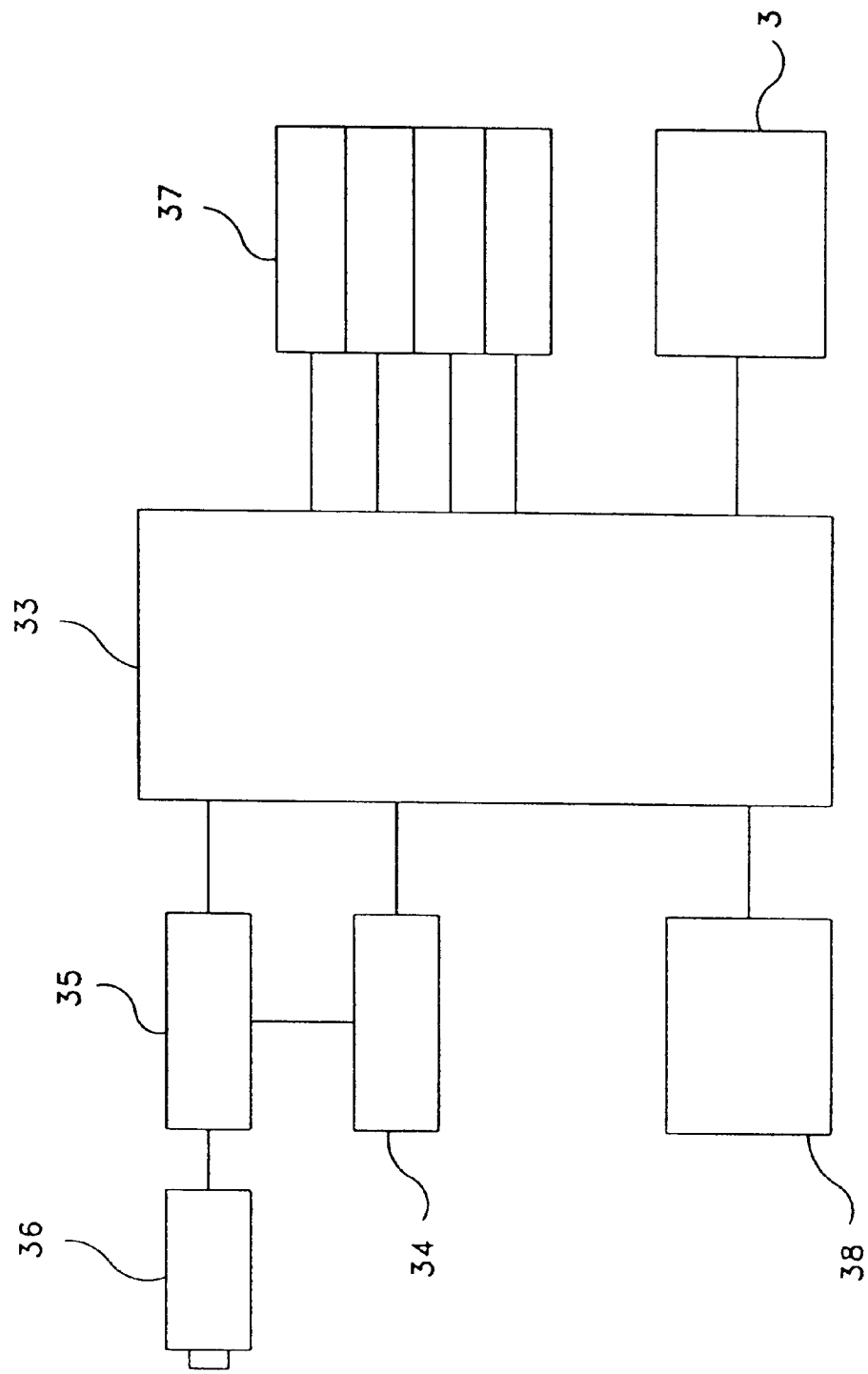
FIG. 10 is a block diagram for driving the carrier according to the present invention.

FIG. 10 is a block diagram showing the driving of the carrier according to the present invention. As shown in FIG. 10, power supply apparatus 34, a driving motor 35 and a step motor 36 are connected to a central processing unit 33 which is installed with charge inspecting device 38 for sensing the charging amount of the battery loaded to charging section 2. The power supply apparatus 34 is connected to the battery to charging it when needed.

Thus, the package box 100D is loaded on the table 3, and the table 3 is fixed by separating prevention ends 3*a*. Then, when an instruction is received into a sensor 37 by the user interface internally provided to terminal M for transferring carrier 100C to a desired location, central processing unit 33 drives first motor 13 installed to driving section 1 of carrier 100C. The power supplied from first motor 13 is transmitted to main roller shaft 21 via motor shaft 13*a*, first pulley 19*a*, chain 20 and second pulley 19*b*. Accordingly, the main roller 22 is driven performing a rolling motion along main rail T.

By the driving of main roller 22, driving section 1 is moved along main rail T. In the meantime, charging section 2 connected to driving section 1 by means of the table 3 is moved by the movement of auxiliary roller 28 along main rail T. Once the main roller 22 and the auxiliary roller 28 initiate movement along main rail T, the balance-keeping roller 7 and the guide roller 9 are also moved along main rail T, thereby preventing the lateral shaking of carrier 100C. Moreover, when carrier 100C is moved along the curved rail, its advancing direction curves by guide roller 9.

When the charge of electric power of the battery decreased by the continuous driving of carrier 100C, charging sensing device 39 senses the decrease of the electric power and connect the battery to the power supply apparatus, thereby automatically charging up the battery.

Should an obstruct be present in the course of the movement, photosensor 10 installed to driving section 1 senses the obstruct to stop carrier 100C. While carrier 100C travels along the curved rail, driving section 1 is located in a tangent line direction without heading forward the curved direction. For this reason, photosensor 10 installed to the frontal upper portion of driving section 1 is not operated during the rotation of the carrier 100c along the curved rail so as to prevent its stoppage. Thus, the possible stoppage, generated when the photsensor senses other facilities installed in the process line on main rail T and interprets them as an obstruct, is avoided.

Since the speed of first motor 13 is controlled by position sensor 12, carrier 100C is moved at high speed when moving along a linear rail and at low speed when moving along a curved rail. When carrier 100C reaches stop device S, a stop signal from stop device S is sensed by position sensor 12 to stop the driving of first motor 13. With the stop of the first motor 13, the driving of carrier 100C is also stopped.

The rail branching apparatus for branching off the rail in order to move carrier 100C to an automatic storage apparatus is illustrated in FIGS. 11 through 17.

Figure 11:
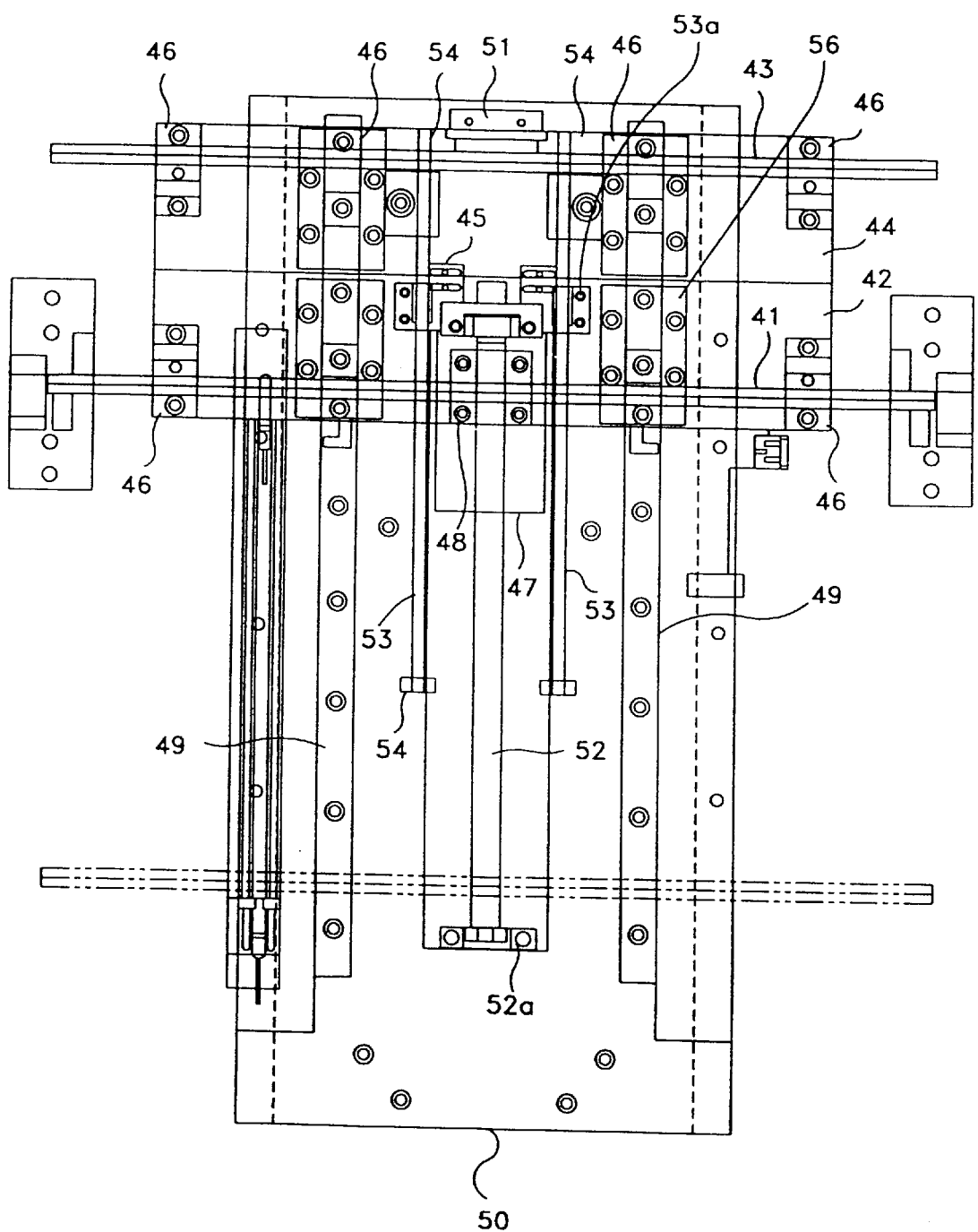
FIG. 11 is a plan view showing the rail branch apparatus according to the present invention.

As shown in FIG. 11, a first rail 41 capable of being separated from main rail T is installed to a third plate 42, and a second rail 43 shaped the same as first rail 41 is installed to fourth plate 44. The second rail 43 is spaced from first rail 41 by a prescribed distance. Third plate 42 and fourth plate 44 are coupled to each other by a mount 45 so each of the plates are in contact side by side. A plurality of brackets 46, preferably eight, for maintaining first rail 41 and second rail 43 in the vertical state are installed to respective corners and the upper and lower ends at the left and right centers of third and fourth plates 42 and 44. A second motor 47, a motive power transmitting unit and a nut member 48 are installed to the central bottom portion of third plate 42.

Guiders 49 are located perpendicular to first and second rails 41 and 43 and positioned at two portion by which third and fourth plates 42 and 44 is divided into three equal parts. Third and fourth plates 42 and 44 are supported by a base 50. A pair of guiders 49 shaped as dove tails serving for guiding the movement of third and fourth plates 42 and 44 are installed in the base 50. The guiders 49 are coupled with guide groove members 56 fixed in the lower portions of third and fourth plates 42 and 44.

A stopper 51 installed in the central upper portion of base 50 make the second rail stop at the accurate position when second rail 43 returns to its original position. A lead screw 52 rotated by second motor 47 is installed in base 50 in parallel with the guiders 49. One side of lead screw 52 is connected to the power transmitting unit and the other end is supported by a bearing 52a to induce the smooth rotation of the lead screw. Third and fourth plates 42 and 44 are guided by two support rods 53 installed in parallel between the lead screw 52 and guiders 49. Support rods 53 are fixed to the base 50 by a plurality of hook mounts 54 and inserted into a pair of holes formed in a guide bracket 53a fixed to the lower portion of third and fourth plates 42 and 44.

Figure 12:
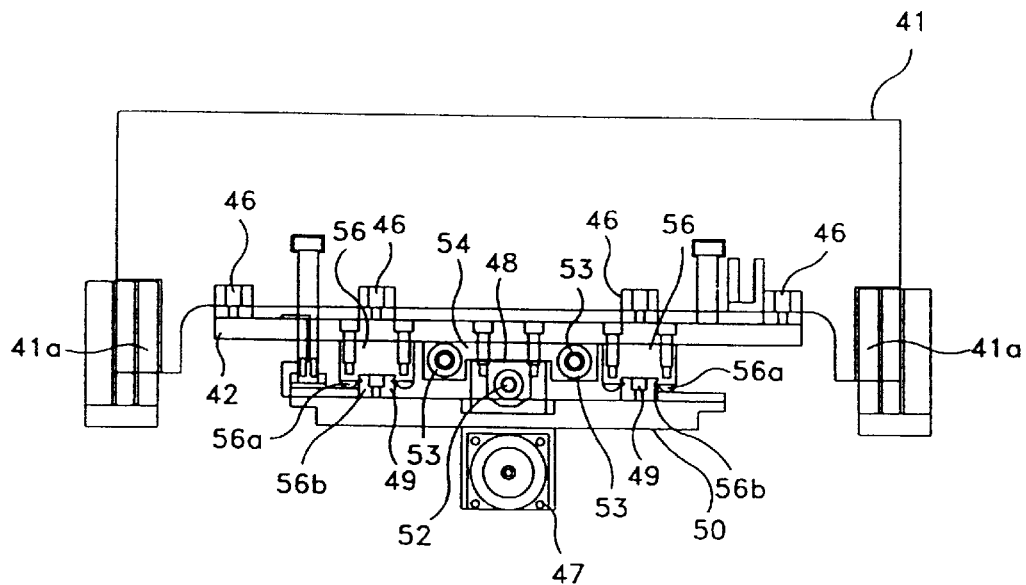
FIG. 12 is a side view showing the rail branch apparatus.

Referring to FIG. 12, the first rail 41 is formed with projections 41a at its lower portion, and fixed to the upper portion of the third plate 42 by means of brackets 46. The third plate 42 is mounted with a nut member 48 which moves back and forth along the spiral of lead screw 52 at the rotating of the lead screw. Guide groove members 56 having guide grooves 56a in both sides are installed to the center of the left side of third plate 42 and to the center of the right side of fourth plates 44. The guiders 49, respectively installed to the left and right of base 50 have projections 49a coupled to grooves 56b formed in guide groove members 56, said projections 49a capable of a sliding motion.

Figure 13:
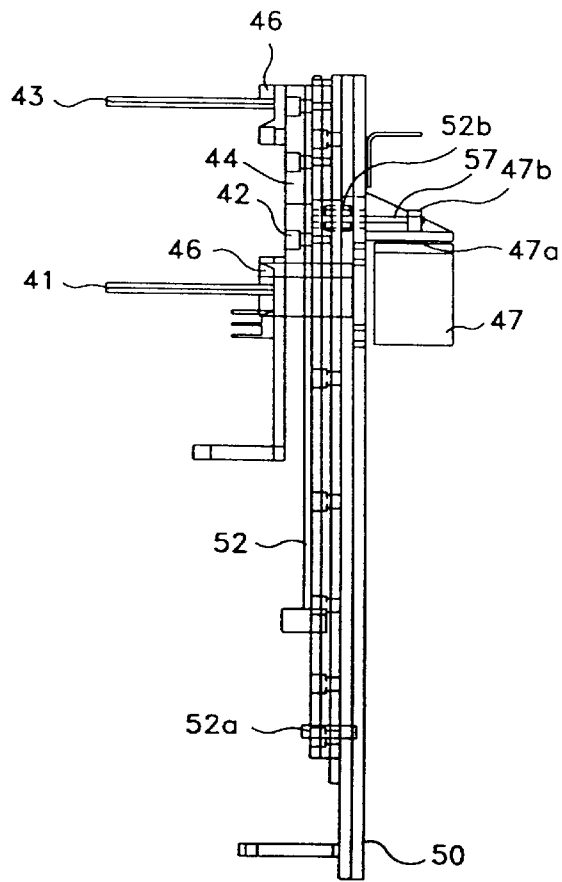
FIG. 13 is a front view showing the rail branch apparatus.

In FIG. 13 which is a front view showing the power transmitting unit, a second motor pulley 47b is joined to a second motor shaft 47a of second motor 47 is installed to the lower portion of base 50. The motive power of second motor 47 is transmitted to lead screw 52 by means of a timing belt 57 installed between the second motor pulley 47b and a screw pulley 52b installed in the lead screw 52.

Figure 14A:
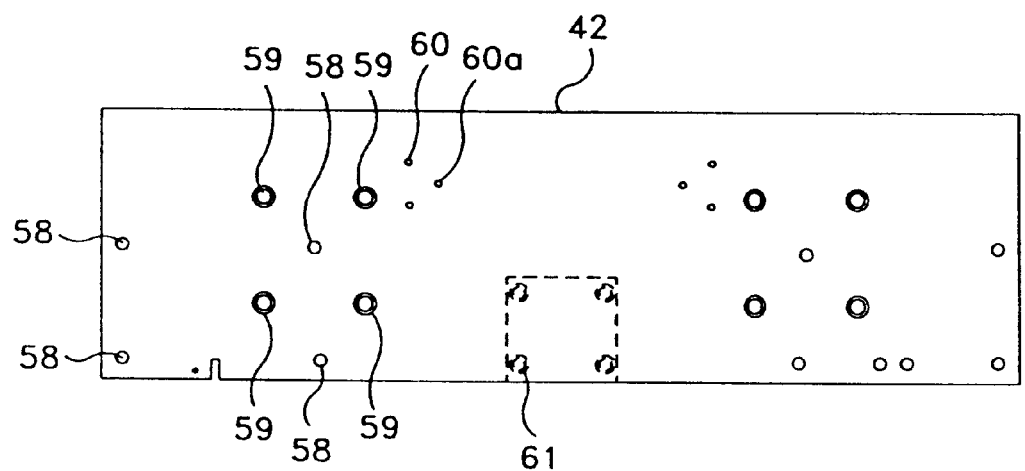
FIGS. 14A and 14B are plan views showing the first plate and second plate of the rail branch apparatus, respectively.

Referring to FIG. 14, rectangular-shaped third plate 42 is formed with a plurality of coupling shaft holes, in which only those holes of the left side will be described since the pattern of holes are symmetrical for the left and right sides. Four bracket-coupling shaft holes 58 in the center and left lower end thereof are formed to install bracket 46 for fixing the rail. Four shaft holes 59 are formed to install guide groove member 54. An oil lubricant injecting hole 60a for supplying an oil lubricant such as a grease and a guide bracket coupling hole 60 are formed in support rods 53, and two nut member coupling shaft holes 61 are formed in the central portion.

Figure 14B:
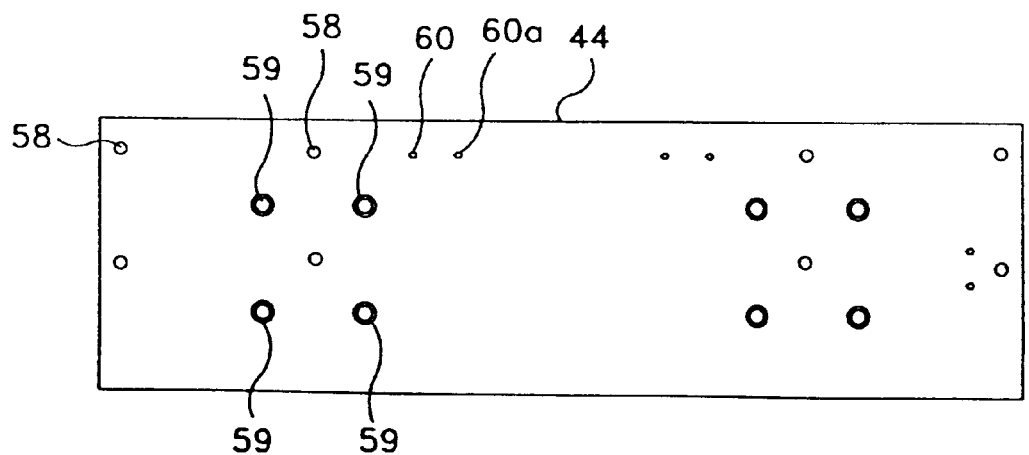

FIG. 14B illustrates the fourth plate 44 which is also rectangular-shaped having a plurality of coupling shaft holes similar to that of third plate 42. Only the left side will only be described as it is symmetrical on the right and left sides, four bracket coupling shaft holes 58 are formed in the center and left upper end and fourth shaft holes 59 are formed to be installed with guide groove member 54. An oil lubricant hole 60a for supplying the oil lubricant such as the grease and guide bracket coupling holes 60 are formed in support rod 53.

Figure 15A:
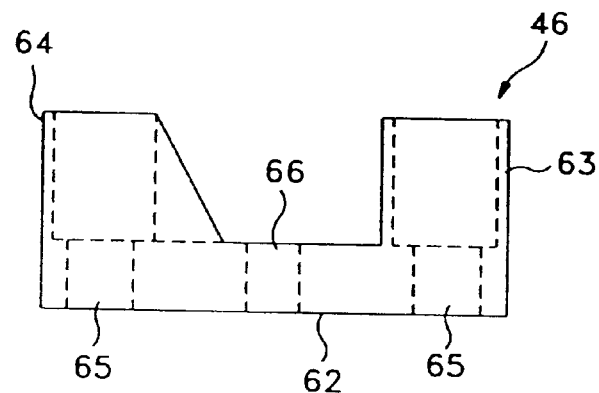
FIGS. 15A and 15B are a front view and a plan view showing the bracket of the rail branch apparatus, respectively.
Figure 15B:
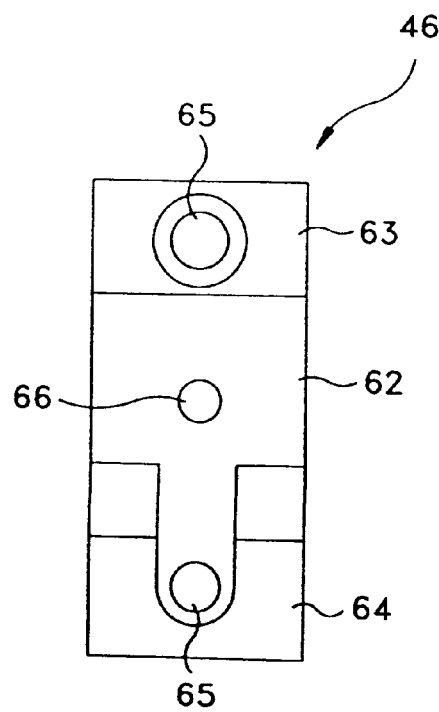

In FIG. 15A, the bracket 46 which maintains the first and second rails 41 and 43 in the vertical direction is formed with a rectangular supporting end 63 for supporting the first and second rails 41 and 43 at the right upper marginal end of rectangular-shaped bottom plate 62, and a fixing end 64 shaped such that its left side has an upwardly projecting slope. Supporting end 63 and fixing end 64 are respectively formed with throughholes 65 that concur with the bracket coupling shaft holes 58 formed in the first and second plates 42 and 44. A throughhole 66 is formed in the center of bottom plate 62 so a fixture for fixing first and second rails 41 and 43 is coupled to the throughhole 66, supported by the supporting ends.

Figure 16A:
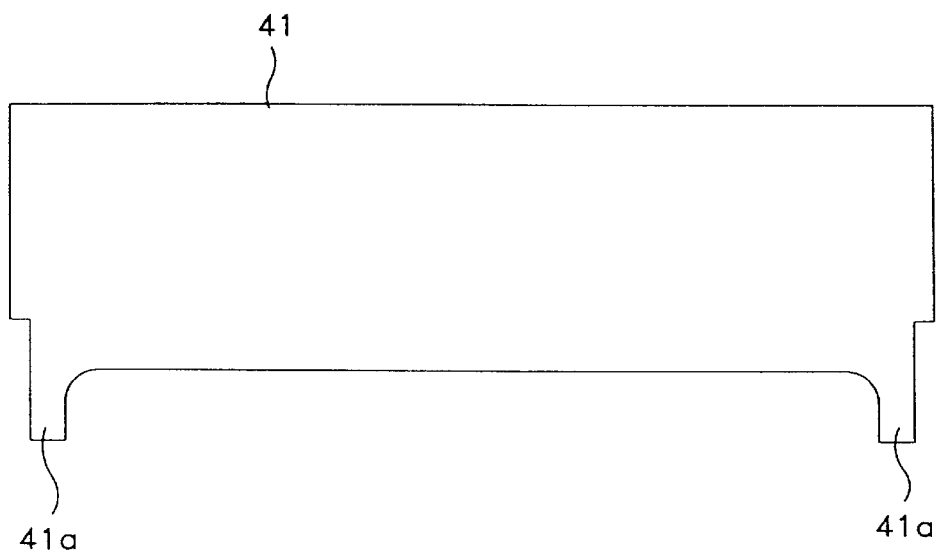
FIGS. 16A and 16B are front views showing the first rail and second rail of the rail branch apparatus, respectively.
Figure 16B:
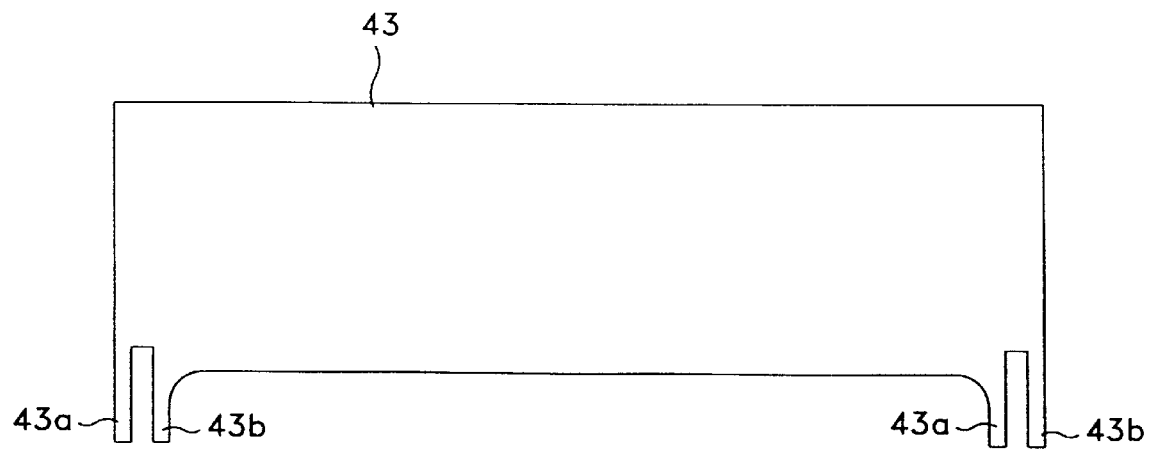

FIGS. 16A and 16B illustrate the first and second rails 41 and 43. First, referring to FIG. 16A, showing first rail 41, rectangular projections 41a are formed at both lower ends, and first and second plates 17 and 29, nut member 48, base 50 and second motor 47 can be installed onto the center of first rail 41. As shown in FIG. 16B, rectangular second rail 43 is formed with two projections 43a and 43b to both lower ends, similar to first rail 41.

Figure 18:
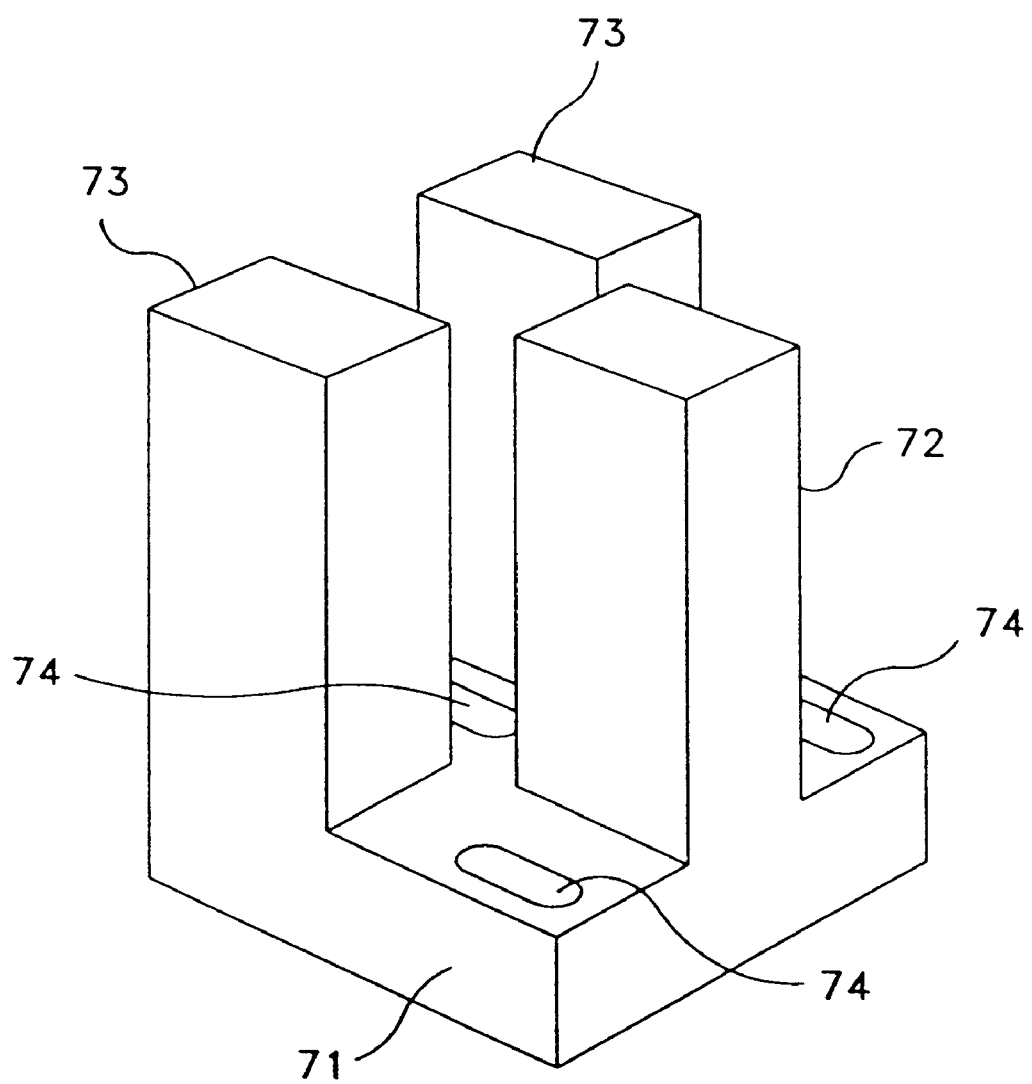
FIG. 18 is a perspective view showing the rail stopper.

A rail stopper 70 illustrated in FIG. 18 is formed with a second rail supporting end 72 projecting on one central upper portion of main body 71 shaped as hexahedron. A width of second rail supporting end 72 is formed to be shorter than a distance between projections 43a and 43b formed at the lower end of second rail 43. Two hexahedral first rail supporting ends 73 are formed to project from both sides of the other side of main body 71. The distance between first rail supporting ends 73 is set to be longer than the width of the projection 41a formed at the lower portion of the first rail 41. Three elongated holes 74 for fixing main body 71 to a fixing frame (not shown) are formed such that one of them is formed between first rail supporting ends 73 and the other two are formed to either side of second rail supporting end 72. By means of these elongated holes 74, rail stopper 70 can be exactly placed to a proper location.

Therefore, while first and second rails 41 and 43 conduct the reciprocating motion along guiders 49, they do not interfere with first and second rail supporting ends 73 and 72 of rail stopper 70. Also, projection 41a of first rail 41 is stopped by contacting second rail supporting end 72, and projections 43a and 43b of third rail 43 are stopped by contacting first rail supporting ends 73. Upon the contacting of first and second rails 41 and 43 to rail stopper 70, the operation of second motor 47 is stopped.

Figure 17A:
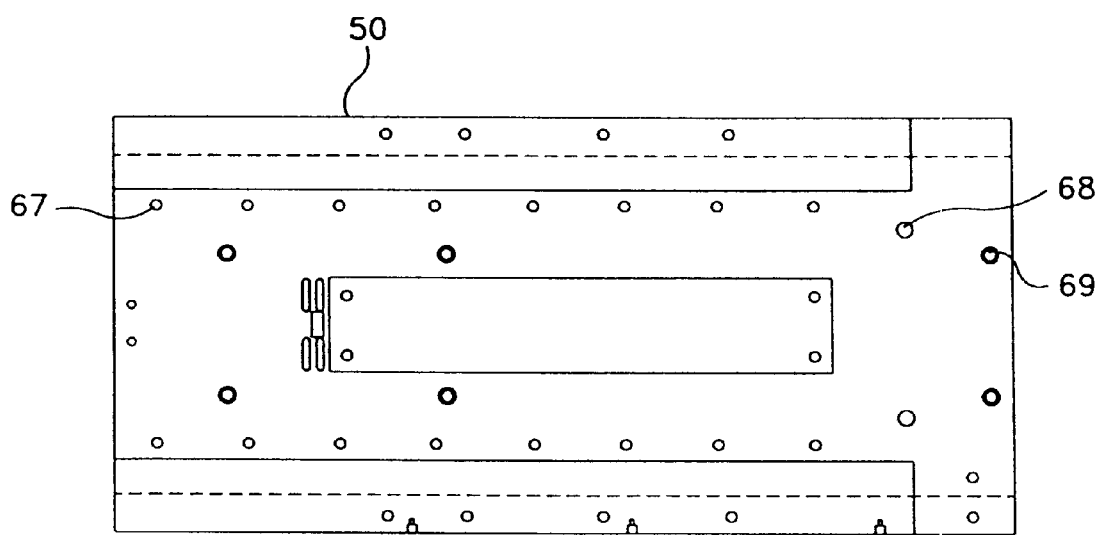
FIGS. 17A and 17B are a plan view and a front view, respectively, showing the base of the rail branch apparatus.
Figure 17B:
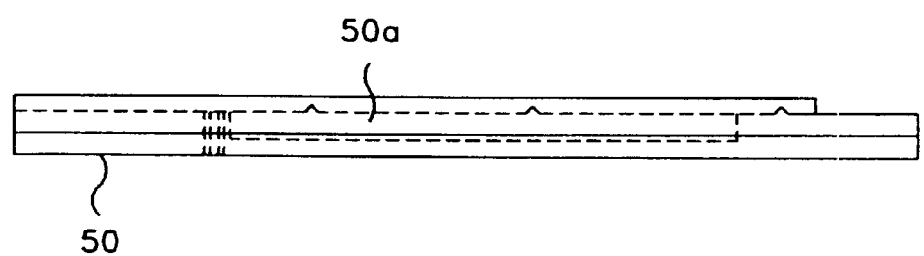

FIG. 17A illustrates the base 50 which is formed with the plurality of coupling shaft holes and formed to be symmetrical vertically. In considering only the upper plane, a plurality of guider coupling shaft holes 67 are formed along the central horizontal line. Here, a shaft hole 68 is formed in the rightmost lower portion among guide coupling shaft holes 67, to coupled with the hook mount 54 which fixes support the rod 53. A stopper coupling shaft hole 69 is formed in the right lower portion of the hook mount coupling shaft hole 68, and the two shaft holes 70a are formed in the lower end of the upper plane. In FIG. 17B, the base 50 consists of three stages and is provided with a groove 50a in the side portion thereof. A shaft hole 70a fixed with bearing 52b for supporting lead screw 52 is formed in right and left ends of groove 50a.

In connection with the rail branch apparatus as thus described, as shown in FIG. 2, since the two apparatuses are serially installed at a location where the stocker 100A is disposed as shown in FIG. 2. The rail diverging from main rail T, main rail T and branched rails are arranged in a straight line by rail stopper 70 shown in FIG. 18.

Figure 19A:
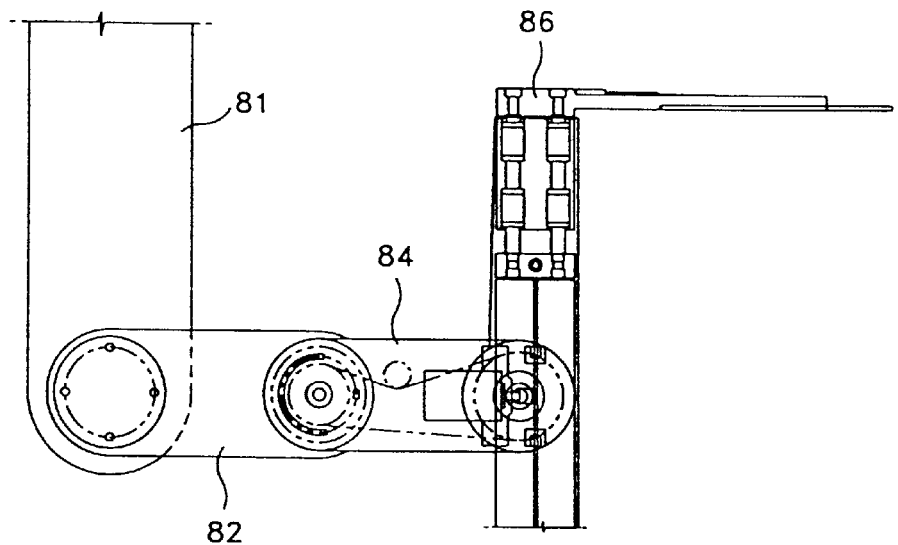
FIGS. 19A and 19B are a plan view and a side elevation view, respectively, showing an overall structure of a pivot arm unit according to the present invention.
Figure 19B:
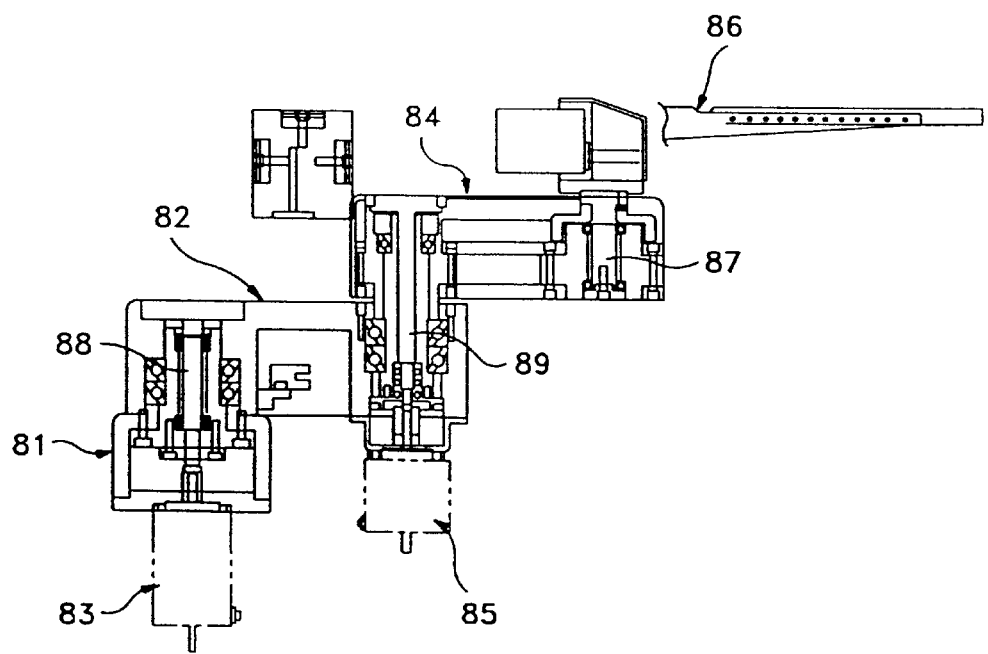

For the above-mentioned structure, the carrier 100C loaded with the package box 100D that packs the wafer is moved along main rail T. The second motor 47 is operated to pick up the package box 100D upon reaching first rail 41 by a pivot arm 86 as shown in FIG. 19A. The motive power produced from second motor 47 is finally transmitted to lead screw 52 via motor shaft 47a, motor pulley 47b and timing belt 57. Along with the rotation of the lead screw 52, the nut member 48 screw-coupled to the lead screw 52 is moved. Thus, first rail 41 installed to third plate 42 installed with nut member 48 is moved. Once first rail 41 begins to move, second rail 43 connected to first rail 41 by means of mount 45 is also moved along guiders 49. When the first rail 41 detaches from main rail T, the second rail 43 moves in to occupy the section of main rail T formerly occupied by first rail 41, thus maintaining the continuity of mail rail T. While the third and fourth plates 42 and 44 are moved together with guiders 49, they are also supported and guided by support rod 53.

After this, the package box 100D is put down from the carrier 100C. When another package box 100D is taken aboard, first rail 41 is returned to main rail T by the backward rotation of second motor 47. By doing so, when the third and fourth plates 42 and 44 are returned to their original position, fourth plate 44 is stopped at the proper place by stopper 51 and thus exactly returns to the original location.

In replacing the first and second rails 41 and 43, they are easily separated from bracket 46 by taking out the fixture joined into supporting shaft hole 66. In addition, since one side of fixing end 64 is sloped, the above operation can be easily carried out.

In addition, the deviation of carrier 100C from the main rail T is prevented if the main rail T and first rail 41 or second rail 43 are accurately aligned when first rail 41 or second rail 43 is moved to the cutaway zone of main rail T to contact main rail T by the branch operation. Accordingly, the positional arrangement of respective rails are accomplished by above-described stopper 51 and rail stopper 70 so as to accurately dispose main rail T and first rail 41 or second rail 43.

The pivot arm unit for picking up the package box 100D stored in storing zone Z to load it onto the carrier 100C or pick up the package box 100D loaded on carrier 100C for piling it on storing zone Z will be described with reference to FIGS. 19A, 19B, 22A, 22B, 22C, and 22D.

As shown in FIG. 19A, the pivot arm unit of the wafer conveyor system according to the present invention includes a fixing arm 81 fixed to a movable holder (not shown) of the pivot arm lift system, and a first robot arm 82 installed to the fixing arm 81. In addition, there are provided a first driving section 83 for driving first robot arm 82, a second robot arm 84 coupled to the other end of the first robot arm 82, a second driving section 85 for driving the second robot arm 84 and a pickup arm 86 coupled to the other end of second robot arm 84.

The first robot arm 82 and second robot arm 84 are independently driven by first driving section 83 and second driving section 85 having a speed ratio of 1:2. The pickup arm driving shaft 87 supported by the second robot arm 84 is moved toward a first robot arm driving shaft 88. At this time, the rotation ratio of second robot arm driving shaft 89 and pickup arm driving shaft 87 rotated by interlocking with second robot arm driving shaft 89 is maintained at 2:1, so that pickup arm 86 performs the linear motion without lateral shaking.

Figure 20:
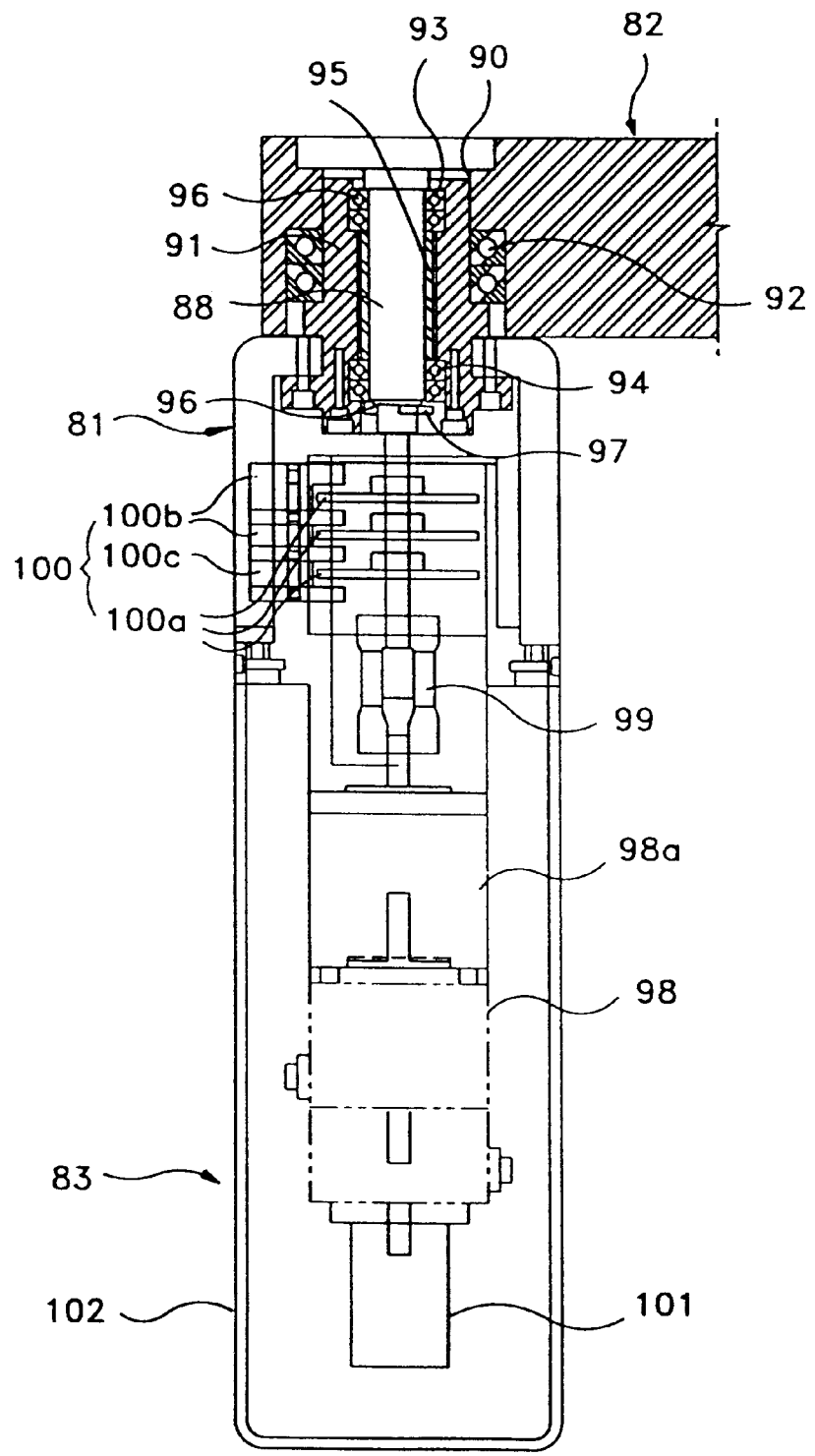
FIG. 20 is a sectional view showing a coupling structure of the first robot arm forming the pivot arm unit shown in FIGS. 19A and 19B.
Figure 21A:
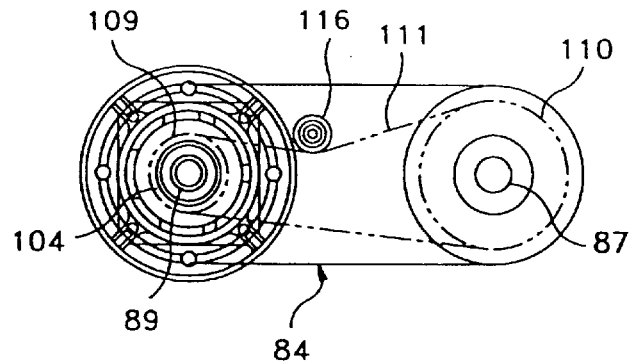
FIGS. 21A and 21B are a plan view and a section view, respectively, showing a coupling structure of the second robot arm.
Figure 21B:
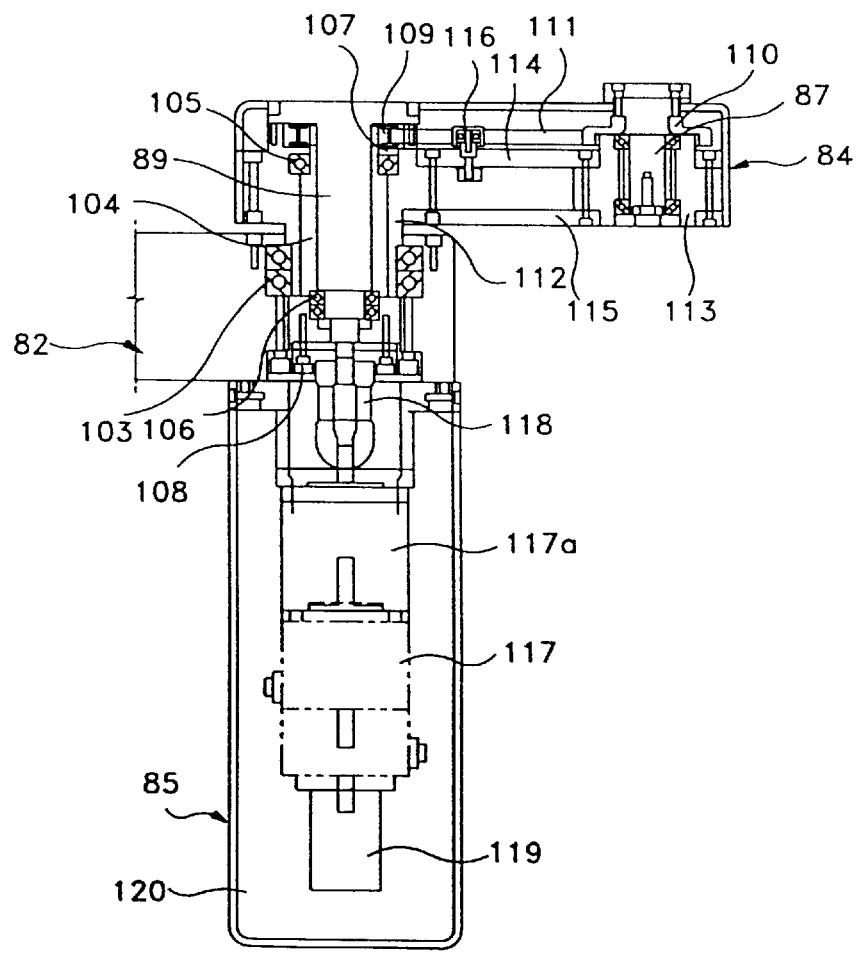
Figure 22D:
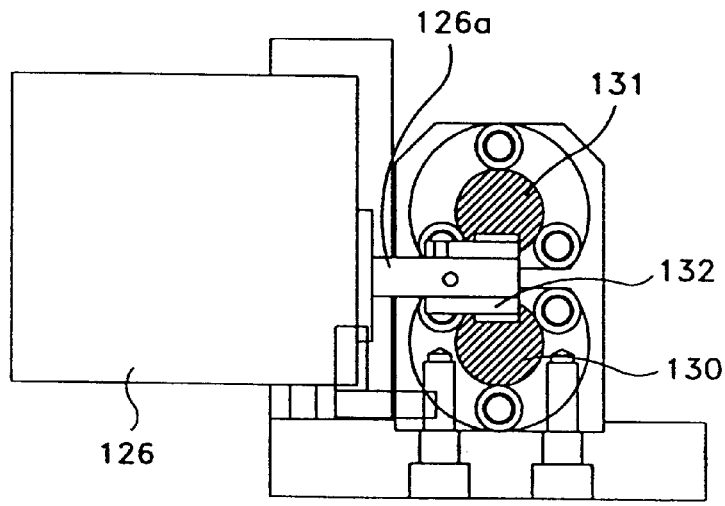
FIG. 22D is a sectional view taken along line 22D—22D of FIG. 22B.
Figure 22E:
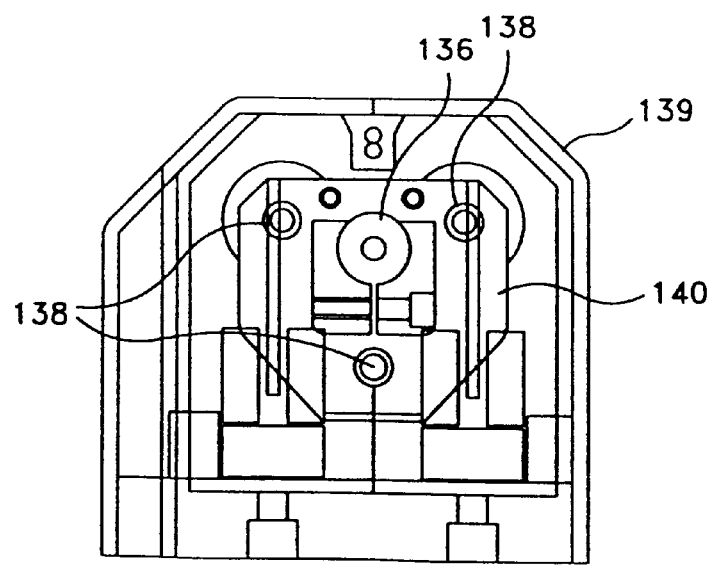
FIG. 22E is a sectional view taken along line 22E—22E of FIG. 22B.

Referring to FIG. 20, the driving shaft 88 of first robot arm 82 has an extending connecting part 90 which is fixed to a bearing housing 91. The bearing housing 91 contains the first driving shaft 88 for rotating first robot arm 82. A bearing 92 supporting first robot arm 82 is installed around the outer periphery of bearing housing 91, and bearings 93 and 94 supporting first driving shaft 88 are installed to both upper and lower ends thereof. By this construction, the first robot arm 82 is supported by the bearings 93 and 94 to be smoothly rotated without the joint portion of the first robot arm 82 being subjected to moment of inertia and torsion by a variable weight.

The first driving shaft 88 is integrally fixed to the first robot arm 82. The bearing housing 91 is fixed to fixing arm 81, so that a force imposed upon bearing housing 91 is dispersed to fixing arm 81. The bearings 93 and 94 respectively installed to the upper and lower portions of bearing housing 91 are installed to be far enough to maintain a distance so as to reduce the reaction force. A spacer 95 is installed between bearings 93 and 94, and a snap ring 96 is fitted into both ends to be fixed and coupled by a bearing fixing nut 97.

The first driving shaft 88 and a third motor 98 are connected by a flexible coupling 99. Thus, at stopping or moving of the robot arm, inertia of the first robot arm 82 is absorbed by flexible coupling 99. The rotational position, stop position and initial position of first robot arm 82 are controlled by a position control unit 100 which includes a plurality of sensor plates 100a installed at the shaft portion placed between first driving shaft 88 and flexible coupling 99, and a sensor attached to fixing arm 81 and sensing sensor plates 100a. The sensor has two limit sensors 100b and one home sensor 10c. An encoder 101 for controlling the position of third motor 98 is installed to the rear side of the third motor 98. The third motor 98, a decelerating gear box 98a for decelerating the motive power of third motor 98 and the encoder 101 are encased by a cover 102.

Consequently, the first driving shaft 88 extending from first driving section 83 is coupled to the first robot arm 82 via the fixing arm 81, and the bearing housing 91, installed around the first driving shaft 88, is screw-coupled with fixing arm 81 so that the first robot arm 82 is assembled, thereby being rotated by the driving of the third motor 98. The first driving shaft 88 is supported by bearings 93 and 94 internally contained within bearing housing 91, and the first robot arm 82, fixed to first driving shaft 88, is supported by bearing 92 retained within bearing housing 91.

Meanwhile, the second robot arm 84 is supported by the bearing 91 at the lower end of first robot arm 82 having the above-described joint structure, and the second driving section 85 for driving second robot arm 84 is placed to the lower portion of second robot arm 84 so they form the joint portion.

The second driving shaft 89 is coupled to the connecting portion of second robot arm 84, and the outer circumference of second driving shaft 89 is wrapped by an insert 104. Additionally, the insert 104 is fixed to first robot, arm 82 and respective bearings 105 and 106 is fixed to the upper and lower portions of insert 104 so they support the second robot arm 84 against the moment of inertia or torsion generated by the weight of the carrier 100C and the second robot arm 84, thereby allowing the second robot arm 84 to be rotated smoothly. A bearing 105 is installed to the upper portion of the insert 104 to support second robot arm 84. The second driving shaft 89 is supported by a bearing 106 installed into the lower portion of insert 104.

A snap ring 107 is inserted into the upper portion of bearing 105, and the lower bearing 106 is supported by a bearing fixing cover 108. Timing pulleys 109 is coupled to the insert 104 provided to the outer circumference of second driving shaft 89 and timing pulley 110 is coupled to the pickup arm driving shaft 87 so they are connected by a timing belt 111. Accordingly, the rotation of the second robot arm 84 is transmitted by the timing belt 111 so that the pickup arm driving shaft 87 rotates. The timing pulley 109 is fixed to the insert 104, and the timing pulley 110 is integrally coupled to pickup arm driving shaft 87. Thus, while second robot arm 84 is rotated, the timing pulley 109 is fixed, and timing belt 111 is rotated on timing pulley 109. Timing pulley 110 fixed to pickup arm driving shaft 87 is rotated by the rotation of timing belt 111.

The pickup arm driving shaft 87 is rotated by the rotation of the timing belt 111. At this time, the two timing pulleys 109 and 110 are respectively rotated in the speed ratio of 2:1 derived from the above-described gear ratio. Furthermore, the second robot arm joint portion includes a first housing 112 for supporting the second driving shaft 89 and a second housing 113 for supporting pickup arm driving shaft 87. The first and second housings 112 and 113 are installed to the upper and lower fixing plates 114 and 115 to constitute the fundamental framework of the second robot arm 84. Pickup arm 86 is coupled to driving shaft 87 internally-contained within second housing 113 to be linearly moved by the rotation of pickup arm driving shaft 87. In the foregoing structure, the tension of the timing belt 111 winding around the timing pulleys 109 and 110 is adjusted by a roller 116 fixed to the upper fixing plate 114.

In terms of the second driving section 85, the second driving shaft 89 coupled to second robot arm 84 and a fourth motor 117 of second driving section 85 are connected by a flexible coupling 118. The second driving section 85 includes: a fourth motor 117; a gear box 117a for decelerating the motive power of the fourth motor 117; and an encoder 119 provided to the rear side of the fourth motor 117 and the second driving section is encircled by a cover 120. Here, the encoder 119 functions to control the position of the fourth motor 117. A position control unit for controlling the rotational position and home position of the second robot arm 84 is provided to a fourth motor shaft, which has a plurality of sensor plates 121 installed to the shaft portion between second driving shaft 89 and flexible coupling 118, and a sensor for sensing sensor plates 121. The sensor consists of two limit sensors 122a and one home sensor 122b.

The pickup arm 86 for gripping the package box 100D is coupled to pickup arm driving shaft 87 supported by the other end of second robot arm 84. The pickup arm 86 includes: a hanger base 123 coupled to pickup arm driving shaft 87; and hanger arms 124 and 125 installed at both sides of the hanger base 123 for fixing package box 100D to move in opposite directions to each other. In addition to the above, the pickup arm further includes: a fifth motor 126 providing the driving force for the hanger arms 124 and 125; a power converting unit 127 for converting the motive power of fifth motor 126 to the linear motion; and a power transmitting unit 128 for transferring the motive power converted by power converting unit 127 to hanger arms 124 and 125.

A package box holder 129 is selectively coupled to the inner side of hanger arms 124 and 125 so it can be exchanged in accordance with the kind of the package boxes. The fifth motor 126 is preferably adopted as a stepping motor. The power converting unit 127 includes a pinion 130 coupled to a fifth motor shaft 126a, and racks 131 and 132 coupled to the upper and lower portions of the pinion 130 to be linearly moved. The rotational force of fifth motor 126 is converted into the linear motion by the pinion 130 and the racks 131 and 132 to be supplied to hanger arms 124 and 125. Put simply, the pickup arm 86 is opened/closed by a single motor.

The power transmitting unit 128 includes power transmitting shafts 135 and 136 respectively connected to racks 131 and 132 by flexible couplings 133 and 134, and guide shafts 137 and 138 connecting power transmitting shafts 135 and 136 to the hangers 124 and 125. Each set of three guide shafts 137 and 138 is arranged in a triangular structure to distribute the load exerting upon pickup arm 86. The guide shafts 137 and 138 are also respectively mounted with the guide bushings 137a and 138a for absorbing the exercising load. The guide shafts 137 and 138 are further connected to 1) power transmitting shafts 135 and 136 by 2) a clamp 140 and a guide shaft fixing mount 139 for fixing the three of each shaft.

The hanger base 123 is equipped with a position sensor 141 for controlling the open/close position of both hanger arms 124 and 125, and a proximity sensor (not shown) for sensing the existence of the package box 100D is installed to a motor cover.

When the motive power of fifth motor 126 is shifted into the linear motion by the racks 131 and 132 joined with pinion 130, the pickup arm 86 linearly moves and the linear motion is transferred to power transmitting shafts 135 and 136. When fixing the power transmitting shafts 135 and 136 to the guide shaft fixing mount 139, hanger arms 124 and 125 connected with guide shafts 137 and 138 are moved from right to left. This motion of hanger arms 124 and 125 allows for the picking up of package box 100D.

At this time, the open/close position of pickup arm 86 is controlled by the position sensor 41, and the presence of the package box 100D is sensed by the proximity sensor. In accordance with such a construction, the load exerted upon the pickup arm 86 is dispersed by the triangular structure of the guide shafts 137 and 138.

The third motor 98 of first driving section 83 is decelerated by gear box 98a at $\frac{1}{10}$ so that its inertia is transferred to the first driving shaft 88 via the flexible coupling 99. By this operation, the first robot arm 82 connected to first driving shaft 88 is rotated at the speed decelerated into ⅟₂₀. Here, the rotational position and initial position of the first robot arm 82 are controlled by the sensor plate 100a and sensors 100b and 100c installed to the first driving shaft 88.

The speed of fourth motor 117 of second driving shaft 85 is decelerated at ⅟₂₀ while passing through gear box 117a, and the inertia by the decelerated speed is transferred to second driving shaft 89 fixed to pickup arm 86 via flexible coupling 118. Thus, the second driving shaft 89 is rotated, and the rotational force of second driving shaft 89 is transferred to pickup arm driving shaft 87 via the timing pulleys 109 and 110 and the timing belt 111. Along with the rotation of the pickup arm driving shaft 87 which is located on the driven side, the pickup arm 86 is also rotated. At this time, the position of the second robot arm 84 is determined by the sensors 100b and 100c and the sensor plate 100a.

In other words, the first robot arm 82 and second robot arm 84 are rotated by the rotational ratio of 2:1 via the above-described procedure wherein the center of the pickup arm driving shaft 87 is moved toward the center of the driving shaft 88 of the first robot arm 82, and the pickup arm 86 performs the linear motion by the gear ratio of 1:2 between the timing pulleys 109 and 110 installed to the second robot arm 84. When the pickup position of the package box 100D is determined according to the foregoing operation, the pickup arm 86 picks up to deliver or store package box 100D. In addition, the motive power of fifth motor 126 is transmitted to hanger arms 124 and 125 placed on both sides of hanger base 123 via power converting unit 127 and power transmitting unit 128, so that hanger arms 124 and 125 pick up package box 100D on their right and left sides. Here, the open/close width of hanger arm 86 is determined by position sensor 141, and the package box 100D to be delivered is loaded/unloaded. In other words, the respective robot arms allow the movement of package box 100D without causing an error by the accurate linear motion of the pickup arm 86.

Figure 23A:
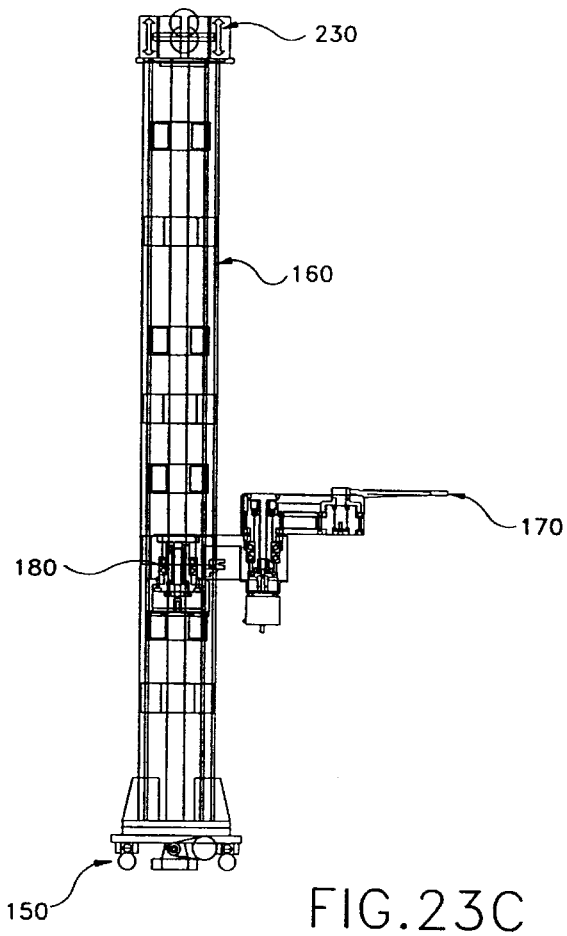
FIGS. 23A, 23B and 23C are a front view, a side view and a plan view respectively showing the pivot arm lifter according to the present invention.
Figure 23B:
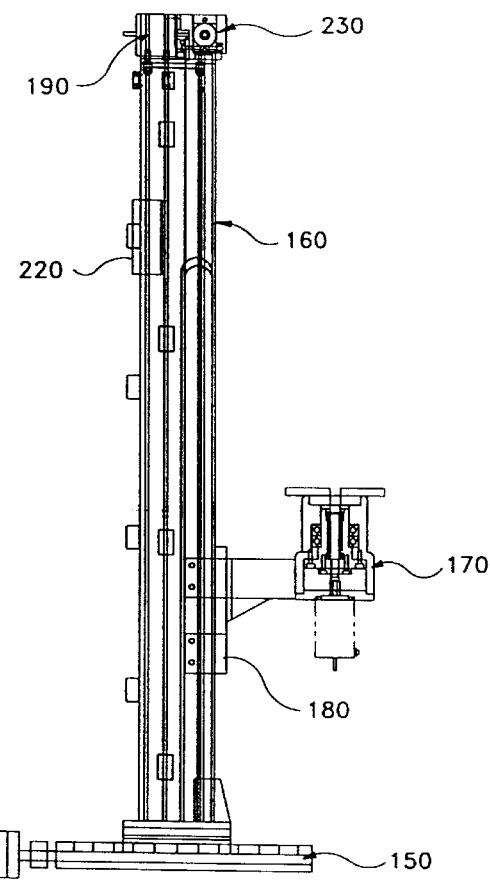
Figure 23C:
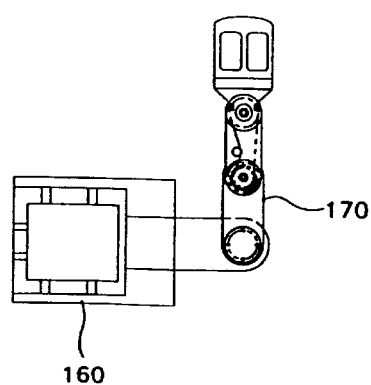
Figure 24A:
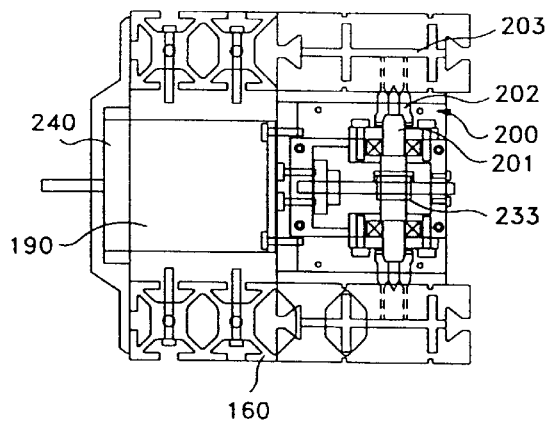
FIGS. 24A, 24B and 24C are a plan view, a side view and a front view, respectively, showing a power decelerating unit of the pivot arm lifter shown in FIG. 23.
Figure 24B:
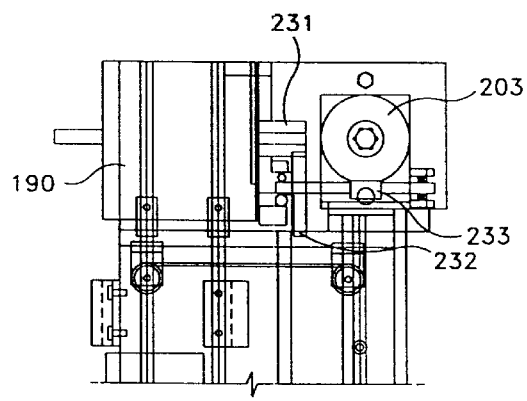
Figure 24C:
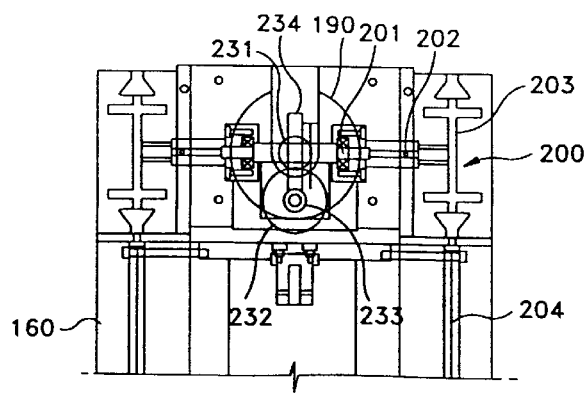
Figure 25A:
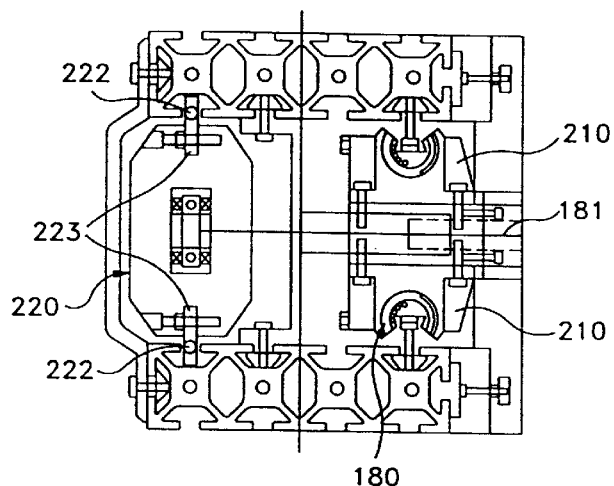
FIGS. 25A and 25B are a plan view of a coupling relation between the vertical feed member of the pivot arm lifter and a balance weight, and a partially cutaway side view of their important components, respectively.
Figure 25B:
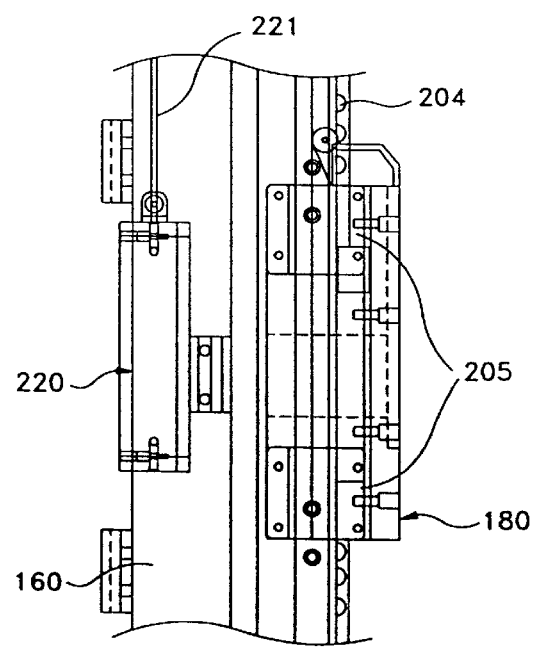

The pivot arm lifter for driving the aforementioned pivot arm unit is shown in FIGS. 23 to 25.

As illustrated, the pivot arm lifter of the wafer conveyor system includes a main body frame 160 installed to be linearly movable along a pivot arm transporting device 150, and a vertical feed member 180 installed to the main body frame 160 movable vertically and having pivot arm unit 170. Furthermore, a sixth motor 190 provides a motive power to vertical feed member 180, and the motive power of sixth motor 190 is transferred to the vertical feed member 180 by a power transmitting unit 200. A guide block 210 for supporting and guiding the rotational moment of inertia of pivot arm unit 170 fixed to vertical feed member 180 is installed to the interior of main body frame 160, so that the vertical feed member 180 is smoothly moved by the guide block 210. Thus, the moment of inertia created during the rotation of pivot arm unit 170 can be reduced.

In addition, a balance weight 220 for decreasing the load imposed upon the sixth motor 190 when the vertical feed member 180 ascends is installed to move reversely from the advancing direction of the vertical feed member 180, thereby decreasing the load of the sixth motor 190 by the weight of the vertical feed member 180.

A power decelerating unit 230 is provided to decelerate the speed of the sixth motor 190 to a proper speed of the vertical feed member 180, which increases the torque of the sixth motor 190 during the vertical feeding and decreases the shaking of sixth motor 190. In the meantime, the guide block 210 is connected to the insert plate 181 of the vertical feed member 180. This connection allows the vertical feed member 180 to be used as a fixing frame regardless of the positioning of the vertical feed member 180.

In addition, the balance weight 220 is connected to the opposite side of the vertical feed member 180 of the main body frame 160 by a wire 221, and a guide unit is provided for guiding the up and down motion of the balance weight 220 to prevent shaking during movement. The guide unit includes a bright shaft 222 for guiding balance weight 220 perpendicularly installed to both internal sides of the main body frame 160 and a guide roller 223 provided to both upper and lower sides of balance weight 220 to allow the bright shaft 22 to conduct the rolling motion. The weight of balance weight 220 corresponds to the sum of the weights of the vertical feed member 180 and of the transferred weights imposed upon pivot arm 86.

Since balance weight 220 has the above-described structure, sixth motor 190 under driving is not applied with the load. For this reason, six motor 190 can be minimized while appropriately encountering the torsion and bending moment of inertia of the structure fixed to the vertical feed member 180.

The power decelerating unit 230 for decelerating the speed of sixth motor 190 according to the present invention is made to allow a user to adjust the lift system at the proper speed, which includes: a driving gear 231 coupled to a shaft of sixth motor 190; a driven gear 232 engaged into driving gear 231; a rack 233 coupled to a driven gear shaft; and a pinion 244 joined to rack 233. The speed of sixth motor 190 is further decelerated according to a gear ratio of driving gear 231 and driven gear 232 and that of rack 233 and pinion 244. The gear ratio of driving gear 231 and driven gear 232 is preferably 1:2, and that of rack 233 and pinion 244 is to be 1:40, so the appropriate speed of the feed member 180 corresponds to 80% of the rotational speed of the motor. More specifically, since driving gear 231 coupled to the shaft of sixth motor 190 is rotated by the driving of sixth motor 190, the driven gear 232 rotates with driving gear 231. At this time, corresponding to the gear ratio of 1:2, the speed of the motor transmitted to the driven gear 232 is primarily decelerated, and rack 233 connected to the driven gear 232 is rotated. When pinion 244 is rotated by the rotation of rack 233, the motor speed transmitted to pinion 244 is decelerated by the gear ratio of 1:40 between rack 233 and pinion 244. Upon the power-off state of the system, the stopper function is executed by the rack 233 and pinion 244.

An electric shaft 201 is coupled to the pinion 244 to be rotated, and the speed decelerated by power transmitting unit 200 involving the electric shaft 201 is transferred to the vertical feed member 180 through the pinion 244. Thus, the vertical feed member 180 ascends and descends along the rail of main body frame 160 to determine the position of pivot arm unit 170. The power transmitting unit 200 has electric shaft 201, a pulley 203 included to a reverse unit to be coupled to a spline shaft 202 formed to electric shaft 201 and a timing belt 204 for connecting pulley 203 and vertical feed member 180. A tension adjusting hole 205 for regulating the tension of timing belt 204 is installed to vertical feed member 180. Pulley 203 is rotated by the rotation of electric shaft 201, and in turn the timing belt 204 fixed to pulley 203 is moved up and down, thereby vertical feed member 180 fixed to timing belt 204 is elevated and lowered.

A position controlling unit obtained by attaching an encoder 240 to the motor controls the up and down positions of vertical feed member 180, and a position determining unit can exactly control the position of vertical feed member 180 by determining the position of pivot arm 86 attached to vertical feed member 180. The position control unit includes limit sensors for stopping pivot arm 86 and a home sensor for determining the initial position in case of an abnormal driving of pivot arm 86, which are not shown in the drawings.

As described above, the rotational speed of driving gear 231 by sixth motor 190 is decelerated to the proper speed in decelerating unit 230 to be transmitted to electric shaft 201. When, spline shaft 202 formed to electric shaft 201 is rotated, drive pulley 203 coupled to spline shaft 202 is also rotated. By this operation, the timing belt 204 fixed to the pulley 203 is moved up and down to elevates and lowers the vertical feed member 180, because the feed member 180 is provided at the end of timing belt 204 in accordance with the moving direction of pulley 203. At this time, guide block 210 for supporting and guiding pivot arm 86 fixed to vertical feed member 180 is installed to the inside of main body frame 160. Accordingly, as the feed member 180 is smoothly moved, the moment of inertia created during the rotation of pivot arm 86 is small.

When ascending the vertical feed member 180, the sixth motor 190 is overloaded by the pivot arm unit 170 and the weight of the transported object. Thus, by installing balance weight 220 for preventing the imposing of the load to the interior of the frame, the load upon sixth motor 190 caused by the weight of the feed member 180 is reduced. Meanwhile, the advancing direction of balance weight 220 is reverse to that of the feed member 180.

The position of the vertical feed member 180 conducting the vertical motion is controlled by the two limit sensors and the home sensor such that the vertical feed member 180 is forcibly stopped by the limit sensors in case of abnormal driving of pivot arm 86. The initial position of the vertical feed member is determined by the home sensor. The position of the pivot arm 86 is determined by the encoder 101 installed to the sixth motor 190. The position of the vertical feed member 180 in the X-axis direction is determined by the pivot arm trans device 150 with the foregoing feeding in the Y-axis direction, and the pivot arm 86 extends to the stroke direction to pickup package box 100D from carrier 100C or load package box 100D onto carrier 100D in the storage space. As described above, the wafer conveyor system according to the present invention is very useful in determining the position of the pivot arm 86 within the stocker 100A for performing the automatic storage and the automatic in/out of the wafer box.

Figure 26A:
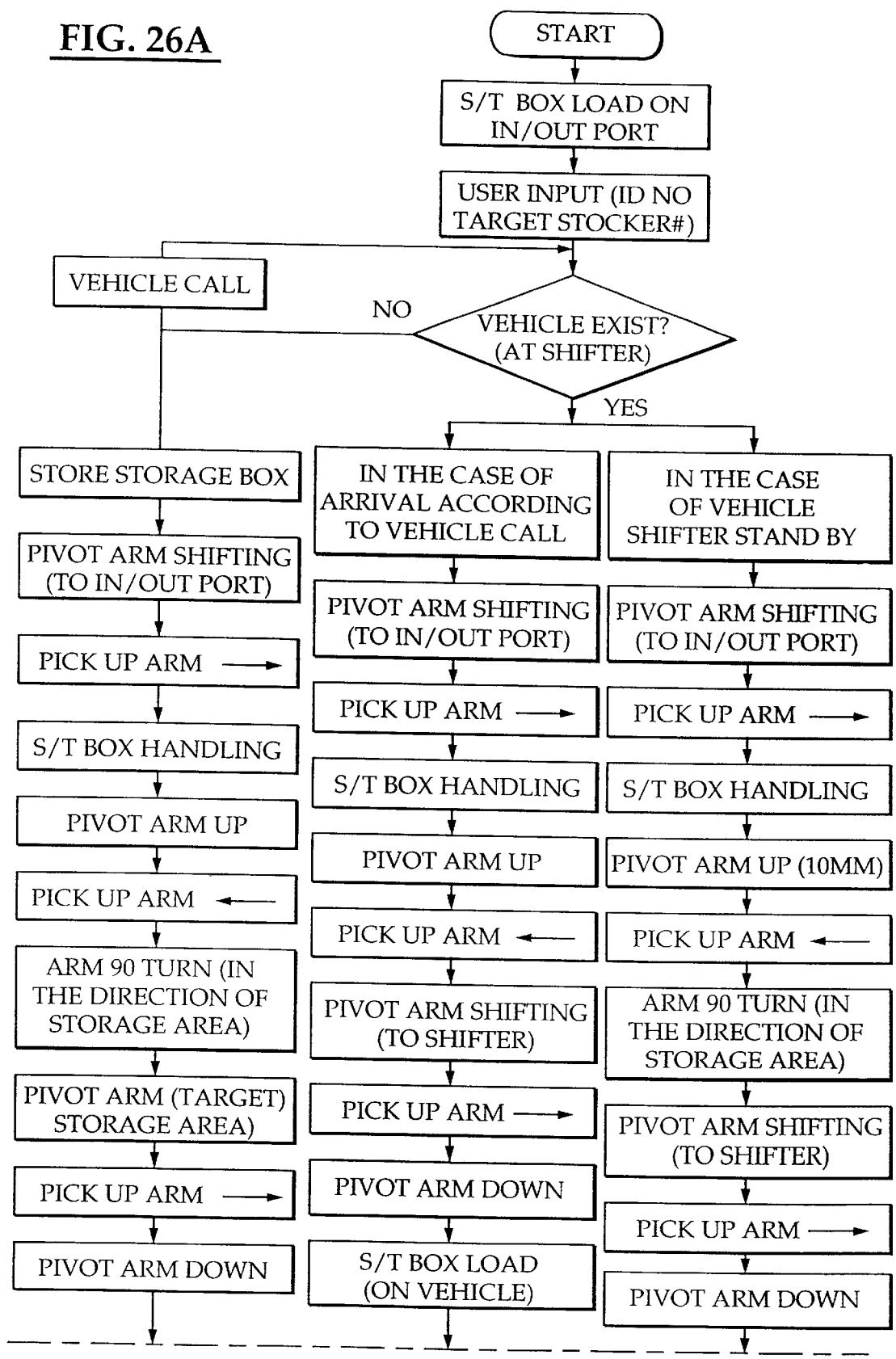
Figure 26B:
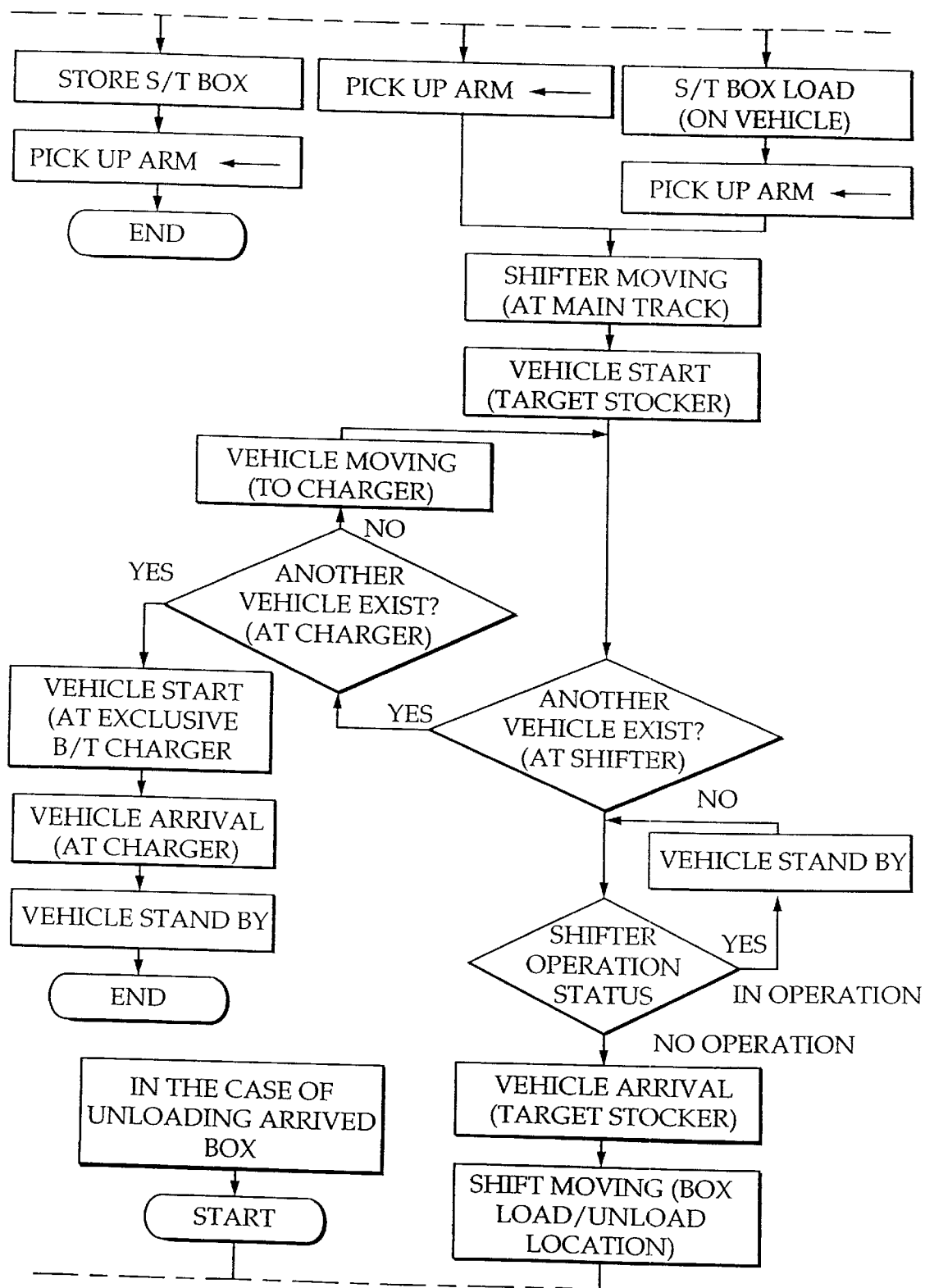

The operation of the wafer conveyor system of the present invention will be described below with reference to FIGS. 26A, 26B and 26C which are related together as shown in FIG. 26.

This wafer conveyor system involves two processes of sending/receiving the package box with the wafer to/from any one stocker, and the respective processes involve different operations.

First, according to the process of sending out the package box, once the user puts the package box onto the inlet/outlet port of the stocker and designates the sending place via the user interface furnished to terminal M, three operations are executed within stocker 100A in accordance with the existence of carrier 100C on the rail branch apparatus. First, there is the operation where carrier 100C is disposed on the rain branch apparatus. At this time, the first rail 41 disposed with carrier 100C thereon is branched from the main rail T to be moved toward the stocker 100A. In addition, under the state that the pivot arm lifter completes overall operation to be placed on the stationary position, vertical feed member 180 is driven to be moved to the inlet/outlet port where package box 100D is put on. Thereafter, the first and second robot arms 82 and 84 of the pivot arm unit 170 are rotated, so that pickup arm 86 is linearly moved to be disposed to the central upper end of package box 100D. While pickup arm 86 grips package box 100D, the vertical feed member 180 ascends by 10 mm to separate the package box 100D from the inlet/outlet port.

The package box 100D separated from the inlet/outlet port is placed in the direction of storage zone Z by the operation so that first and second robot arms 82 and 84 are reversely rotated to retreat and first robot arm 82 is rotated by 90°. Upon the completion of 90° rotation of the first robot arm 82, the pivot arm trans apparatus 150 and the vertical feed member 180 are simultaneously driven, and the package box 100D is positioned to the center of the rail branch apparatus. When package box 100D reaches to the inlet/outlet positions of the rail branch apparatus, the first and second robot arms 82 and 84 are rotated. By this operation, the package box 100D gripped by pickup arm 86 is placed to the center of the carrier 100C, and then directly placed on the carrier 100C by the descending of vertical feed member 180 by 10 mm. The gripping of package box 100D positioned onto the carrier 100C is released by widening the end of the pickup arm 86.

At the same time, the first and second robot arms 82 and 84 return pickup arm 86 to the initial position. Then, once the first rail 41 returns to the position of main rail T, the carrier 100C is moved to the input place. Here, package box 100D's identification number recorded on the user interface of stocker 100A and a number set to the stocker 100A of the designated place are transmitted to the carrier 100C via the communication port of an information management part of the carrier 100C.

Secondly, there is a case that the carrier 100C is not placed on the rail branch apparatus. At this time, as described above, the package box 100D is disposed on the inlet/outlet port by the user, and the pivot arm trans apparatus 150 and the vertical feed member 180 situated at an arbitrary place are simultaneously driven to move the pivot arm unit 170 fixed to the vertical feed member 180 to inlet/outlet port P once the package box's 100d identification number and the location's stocker number are input. After this operation, the first and second robot arms 82 and 84 are rotated to linearly advance the pickup arm 86 and to be placed onto the center of the package box 100D. In turn, the package box 100D is gripped by the end of pickup arm mounted to the upper portion of second robot arm 84. Pickup arm 86 gripping the package box 100D retreats by the first and second robot arms 82 and 84, and the first robot arm 82 is rotated by 90° to rotate package box 100D toward storage zone Z.

The pivot arm transporting device 150 and the vertical feed member 180 are simultaneously moved to an empty space in storage zone Z of stocker 100A. Upon the completion of the above operation, the package box 100D is delivered to the storage zone Z by the first and second robot arms 82 and 84. At this time, the vertical feed member 180 descends by 10 mm to place the package box 100D gripped by the pickup arm 86 on storage zone Z and then releases the package box 100D. Next, the first and second robot arms 82 and 84 retreat to the home places, thereby finishing the operation. At this time, the information about the package box 100D stored in the storage zone Z is stored in the information management part, and the package box 100D is in stand-by until the carrier 100C reaches the rail branch apparatus.

Third, an operation where the package box 100D stored in the storage zone Z to wait for the arrival of the carrier is to be sent to another place is executed as below. Once the carrier 100C is departed from another zone to reach the first rail 41 which is branched from main rail T to move to the inlet/outlet position of package box 100D. Simultaneously, second rail 43 moves to the position of first rail 41 of main rail T to maintain the continuity of main rail T so that another carrier travels along main rail T. When the above operation is completed, the approach of carrier 100C is sensed by the communication between a communicating part of the carrier 100C and the information management part of the automatic storage apparatus. At the same time, the pivot arm trans apparatus 150 and the vertical feed member 180 disposed on an arbitrary places are simultaneously driven to be moved to the storage zone Z stored with the package box 100D. When the delivery of the package box 100D is completed, it is taken out.

Upon the completion of the delivery of the package box 100D, the package box 100D gripped by the pivot arm 86 is transferred to the inlet/outlet position on the branched first rail 41 to dispose the package box 100D onto the carrier 100C by the foregoing operation of the pivot arm 86. At this time, the information stored in the information management part is transmitted to the carrier 100C via the communication port of the carrier 100C by the communication between carrier 100C and the information management part.

In the reverse case that the package box 100D supplied from another stocker is received, the carrier 100C stops as soon as the signal produced by the stop device S installed on the upper end of the stocker so that the deviation of carrier 100C from the rail can be prevented when the rail branch apparatus is being operated to diverge the first rail 41 or the second rail 43 from the main rail T while the carrier 100C is transported to the original stocker. Once first rail 41 or second rail 43 is moved toward main rail T, the signal of stop device S is blocked to continuously move the carrier.

When carrier 100C is transferred to stop onto the first rail 41 of the rail branch apparatus, the first rail 41 is diverged from the main rail T to be moved to the inlet/outlet position of the package box 100D. Upon the completion of the division of first rail 41, the information about the package box 100D put on the carrier 100C is supplied to the user interface. In the meantime, the pivot arm 86 mounted to the pivot arm trans apparatus 150 and vertical feed member 180 stopping on the optional place is transferred to the central portion of the rail branch apparatus. Thereafter, the package box 100D on the carrier 100C is put down from the carrier 100C by the above-stated operation, and the pivot arm lifter is moved and disposed on an optional storage zone Z. Then, the package box 100D gripped by the pickup arm 86 is stored in the storage zone Z and the pickup arm 86 retreats, thereby completing the operation. At this time, the user interface indicates that the package box 100D is stored in storage zone Z, and, simultaneously, package box's 100D identification number is displayed to finish the operation.

When the operation for the package box 100D stored in the storage zone Z of the stocker after supplied from another stocker is taken out in accordance with the above-described operation, the information of the package box 100D is confirmed in the user interface. Once the package box's 100D identification number and an instruction of putting out the package box 100D is received into the user interface, the pivot arm lifter and pivot arm trans apparatus 150 are operated to transfer the pivot arm 86 to storage zone Z, so that the package box 100D is drawn out by the pivot arm to be positioned at the inlet/outlet port. In conformity with the above-described operation, the package box is either put on the carrier within the stocker or taken down from the carrier, and the information about the overall operation of the storage, in/out of the package box is confirmed by the user interface.

In the wafer conveyor system according to the present invention, the delivery of the wafer having been manually-executed heretofore to the respective process units is fully automated and overall conveyor system is managed under the central control. Therefore, the wafer can be swiftly and correctly delivered while enhancing overall management efficiency of the overall conveyor system.

Also, the carrier according to the present invention is equipped with the charging device as well as the charging inspect device. Thus, by detecting the decrease in the charging amount of the battery, the battery comes to be connected to the power supply apparatus for automatically charging the battery, so that the driving time of the carrier can be extended. In addition, the sensors for receiving instructions of driving, decelerating, accelerating and stopping are installed to the user interface to enable automatic transfer of the carrier, thereby shortening the processing period and realizing the rapid delivery system.

The pivot arm unit according to the present invention has the robot arms firmly coupled to each other to prevent the drooping caused by the variable weight. Consequently, the pivot arm unit is advantageous in that the heavy object is effectively delivered with the long delivery distance. Furthermore, the pickup arm can be replaced corresponding to the process characteristic to be employed for another use and greatly facilitate the repair and handling.

Moreover, the wafer conveyor system according to the present invention is preferably applied to a system having the long delivery distance, suitable for the delivery of an object with a heavy weight, strongly resistant to the torsion turning and moment of inertia, and can be actuated by a small motor.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A wafer conveyor system comprising:
   a stocker for storing and delivering a package box with a plurality of wafers therein;
   a transferring path for connecting one stocker with another stocker;
   a carrier traveling along said transferring path for transporting said package box between said stockers;
   an automatic charging device placed to any one position of said transferring path for charging a battery loaded onto said carrier traveling along said transferring path when said battery is discharged; and
   a central control unit for controlling the driving of said stocker, transferring path, carrier and automatic charging device, and
wherein said stocker comprises:
   a storing section having a plurality of storage zones for storing the package boxes;
   a pivot arm unit for putting said package box in said storing section onto said carrier, and transporting said package box delivered by said carrier to the corresponding storage zone of said storing section; and a pivot arm lifter for transferring said pivot arm unit up-and-down and side-to-side, and wherein said pivot arm unit comprises:

a fixing arm fixed to a moving holder of said pivot arm lifter;

a first robot arm installed to said fixing arm;

a first driving section for driving said first robot arm to be rotatable;

a second robot arm installed to the other end of said first robot arm;

a second driving section for driving said second robot arm; and a pickup arm installed to the other end of said second robot arm, whereby said first robot arm and second robot arm are independently driven by separate driving motors rotated in a speed ratio of 1:2 to allow a pickup arm driving shaft to conduct the linear motion toward the center of a first robot arm driving shaft, and a rotational ratio of a second robot arm driving shaft and said pickup arm driving shaft rotated with said second robot arm driving shaft is maintained by 2:1 to allow said pickup arm to conduct the linear motion.

2. A wafer conveyor system as claimed in claim 1, wherein a joint portion of said second robot arm comprises an insert fixed to said first robot arm to encircle the outer circumference of said second driving shaft of said second robot arm coupled to said first robot arm, and rotation supporting bearings respectively installed to the upper and lower portions of said insert, whereby said arm is sustained against the moment of inertia and torsion caused by the deadweight of said arm and delivering weight to be smoothly rotated.

3. A wafer conveyor system as claimed in claim 2, wherein a timing pulley is fixed to said insert, and said timing pulley and pickup arm driving shaft are connected by a timing belt for rotating said pickup arm driving shaft along with the rotation of said second robot arm.

4. A wafer conveyor system as claimed in claim 3, further comprising a first housing for supporting said second driving shaft and a second housing for supporting said pickup arm driving shaft, wherein first and second housings are joined by upper and lower fixing plates to form a frame of said second robot arm.

5. A wafer conveyor system as claimed in claim 3, further comprising a roller fixedly installed to said upper fixing plate for maintaining a proper tension of said timing belt.

6. A wafer conveyor system as claimed in claim 2, further comprising a motor position-controlling encoder for connecting said second driving shaft coupled to said second robot arm and a motor shaft of said second driving section by means of a flexible coupling, and position control means for controlling the rotational position and home position of said second robot arm.

7. A wafer conveyor system as claimed in claim 6, wherein said position control means comprises:

a plurality of sensor plates installed to a shaft portion between said second driving shaft and flexible coupling; and a sensing section having two limit sensors and one home sensor for respectively sensing the positions of said sensor plates.

8. A wafer conveyor system as claimed in claim 7, wherein said pickup arm comprises:

a hanger base joined to said driving shaft of said second robot arm;

a hanger arm installed to be moved at both sides of said hanger base in the opposite direction for fixing said package box;

a motor for affording a driving force to said hanger arm;

power converting means for converting a motive power of said motor into the side-to-side linear motion; and power transmitting means for transmitting the motive power converted by said power converting means to said hanger arm.

9. A wafer conveyor system as claimed in claim 8, comprising a package box holder capable being exchangeably used in accordance with the kind of said package boxes by being coupled to be separable from the inner side of said hanger arm.

10. A wafer conveyor system as claimed in claim 8, wherein said power converting means comprises a pinion coupled to said motor shaft; and racks coupled to the upper and lower portions of said pinion.

11. A wafer conveyor system as claimed in claim 8, wherein said power transmitting means comprises a power transmitting shaft coupled to said rack by means of said flexible coupling, and a guide shaft connected to said power transmitting shaft and hanger arm while having a triangular structure of three-to-one set capable of distributing and supporting a variable weight load imposed upon said hanger arm.

12. A wafer conveyor system as claimed in claim 11, wherein said guide shaft is connected to said power transmitting shaft by a guide shaft fix mount for integrally fixing three guide shafts and a clamp for fixing said power transmitting shaft to be coupled to a shaft fixing holder.

13. A wafer conveyor system as claimed in claim 11, wherein a guide bushing for absorbing the load exerting upon said guide shaft is mounted to said guide shaft.

14. A wafer conveyor system as claimed in claim 8, further comprising a position sensor for controlling the open/close positions of said hanger arm.

15. A wafer conveyor system as claimed in claim 8, further comprising a proximity sensor for sensing the existence of said package box installed to a motor cover.

16. A wafer conveyor system comprising:

a stocker for storing and delivering a package box with a plurality of wafers therein;

a transferring path for connecting one stocker with another stocker;

a carrier traveling along said transferring path for transporting said package box between said stockers;

an automatic charging device placed to any one position of said transferring path for charging a battery loaded onto said carrier traveling along said transferring path when said battery is discharged; and a central control unit for controlling the driving of said stocker, transferring path, carrier and automatic charging device, and wherein said stocker comprises:

a storing section having a plurality of storage zones for storing the package boxes;

a pivot arm unit for putting said package box in said storing section onto said carrier, and transporting said package box delivered by said carrier to the corresponding storage zone of said storing section; and a pivot arm lifter for transferring said pivot arm unit up-and-down and side-to-side, and wherein a joint portion of said first robot arm is constructed such that a driving shaft connecting portion of said first robot arm extends to be fitted with a bearing housing, a first driving shaft for rotating said first robot arm is fitted into an inner diameter of said bearing housing, and a bearing for supporting said first robot arm is installed to an outer circumference of said bearing housing while bearings for supporting said first driving shaft are installed to upper and lower ends of said inner diameter.

17. A wafer conveyor system as claimed in claim 16, wherein said bearing housing is fixed to said fixing arm for distributing an exerting reaction force by said fixing arm, and a distance between said bearings respectively installed to said upper and lower ends of said inner diameter of said bearing housing is maximally provided to decrease said reaction force imposed upon said bearings.

18. A wafer conveyor system as claimed in claim 16, wherein said first driving shaft coupled to said first robot arm and a motor shaft of said driving section are joined by a flexible coupling for absorbing the inertia exerting upon said first robot arm during the stop and moving operations, said wafer conveyor system further comprising position control means for controlling the rotating and stop positions and the initial position of said first robot arm.

19. A wafer conveyor system as claimed in claim 18, wherein said position control means comprises:
   a plurality of sensor plates installed to a shaft portion between said first driving shaft and flexible coupling; and
   a sensing section having two limit sensors and one home sensor for respectively sensing the positions of said sensor plates.

20. A wafer conveyor system as claimed in claim 16, wherein said carrier comprises:
   a driving section having driving means onto the front of a table loaded with said package box thereon;
   a charging section equipped with said battery for supplying the electric said power to said driving means at the rear portion thereof; and
   control means for controlling the driving of said driving means.

21. A wafer conveyor system comprising:
   a stocker for storing and delivering a package box with a plurality of wafers therein;
   a transferring path for connecting one stocker with another stocker;
   a carrier traveling along said transferring path for transporting said package box between said stockers;
   an automatic charging device placed to any one position of said transferring path for charging a battery loaded onto said carrier traveling along said transferring path when said battery is discharged; and
   a central control unit for controlling the driving of said stocker, transferring path, carrier and automatic charging device, and
wherein said stocker comprises:
   a storing section having a plurality of storage zones for storing the package boxes;
   a pivot arm unit for putting said package box in said storing section onto said carrier, and transporting said package box delivered by said carrier to the corresponding storage zone of said storing section; and
   a pivot arm lifter for transferring said pivot arm unit up-and-down and side-to-side, and wherein said pivot arm lifter comprises:
   a main body frame erectly installed to be linearly movable along a pivot arm trans apparatus;
   a vertical feed member installed to be movable up and down to said main body frame by fixing said pivot arm unit;
   a motor for providing a motive power to said vertical feed member;
   power transmitting means for transmitting said motive power of said motor to said vertical feed member;
   a guide block installed to the interior of said main body frame for supporting and guiding the rotational moment of inertia of said pivot arm unit fixed to said vertical feed member and supporting the moment of inertia applied during the rotation of said pivot arm unit;
   a balance weight installed to be moved in the opposite direction to the advancing direction of said vertical feed member for decreasing the load exerting upon said motor when said vertical feed member ascends; and
   power decelerating means for decelerating the motive power of said motor to the proper speed of said vertical feed member.

22. A wafer conveyor system as claimed in claim 21, wherein said guide block is connected to an insert plate of said vertical feed member.

23. A wafer conveyor system as claimed in claim 21, wherein said balance weight is connected to the opposite side of said vertical feed member of said main body frame by a wire, and comprises guide means for guiding the up and down movement of said balance weight.

24. A wafer conveyor system as claimed in claim 23, wherein the weight of said balance weight corresponds to the sum of the weight of said vertical feed member and a transferred variable weighing object to said pivot arm.

25. A wafer conveyor system as claimed in claim 23, wherein said guiding means comprises a bright shaft erectly installed to both insides of said main body frame, and a guide rollers installed to both upper and lower portions of said balance weight to conduct a rolling motion with said bright shaft.

26. A wafer conveyor system as claimed in claim 21, wherein said power decelerating means comprises a driving gear coupled to said motor shaft, a driven gear engaged with said driving gear; a rack joined to a driven gear shaft and a pinion engaged with said rack to be rotated,
   whereby the motor speed is secondarily decelerated by a gear ratio of said driving gear and driven gear and that of said rack and pinion.

27. A wafer conveyor system as claimed in claim 26, wherein said driving gear and driven gear have the gear ratio of 1:2 and the gear ratio of said rack and pinion is 1:40 to make the proper speed of said vertical feed member be at least 80% of the motor rotating force.

28. A wafer conveyor system as claimed in claim 21, wherein said power transmitting means comprises an electric shaft piercing through said pinion of said power decelerating means and a timing belt for connecting said vertical feed member and a pulley spline-coupled to said electric shaft for being rotated.

29. A wafer conveyor system as claimed in claim 28, wherein said vertical feed member connected by said timing belt is installed with a tension adjusting hole for regulating the tension of said timing belt.

30. A wafer conveyor system as claimed in claim 21, further comprising position control means for controlling the up and down position of said vertical feed member, and position determining means for determining the position of said pivot arm attached to said vertical feed member.

31. A wafer conveyor system as claimed in claim 31, wherein said position control means comprises limit sensors for forcibly stopping said pivot arm in case of an abnormal driving, and a home sensor for determining an initial position.

32. A wafer conveyor system as claimed in claim 30, wherein said position determining means is an encoder installed to said motor.

33. A wafer conveyor system comprising:
a stocker for storing and delivering a package box with a plurality of wafers therein;
a transferring path for connecting one stocker with another stocker;
a carrier traveling along said transferring path for transporting said package box between said stockers;
an automatic charging device placed to any one position of said transferring path for charging a battery loaded onto said carrier traveling along said transferring path when said battery is discharged; and
a central control unit for controlling the driving of said stocker, transferring path, carrier and automatic charging device, and
wherein said transferring path comprises a main rail installed by connecting said stockers furnished to respective process lines, and a branch apparatus for transporting said carrier traveling along said main rail toward said stocker, and
wherein said branch apparatus comprises:
a first rail perpendicularly separated from said main rail to be moved;
a second rail installed to be opposite to said first rail by maintaining a predetermined distance from said first rail;
plates for supporting said first rail and second rail;
guiders for guiding the movement of said plates; driving means for supplying a motive power to said plates; and
a base for supporting said driving means and guiders.

34. A wafer conveyor system as claimed in claim 33, wherein a bracket for maintaining the perpendicular state of said first rail and second rail.

35. A wafer conveyor system as claimed in claim 34, wherein said bracket comprises a support end and a fixing end for supporting said first rail and second rail projecting from both sides of a bottom plane thereof, and a shaft hole in the central portion thereof for fixing a fixture supporting said first rail and second rail together with said supporting end.

36. A wafer conveyor system as claimed in claim 33, wherein said driving means comprises a motor being a driving source; means for transmitting said motive power of said motor; a lead screw rotated by said motive power from said power transmitting means; and a nut member mounted to said plate for reciprocating along said lead screw.

37. A wafer conveyor system as claimed in claim 36, wherein said power transmitting means is comprised of a timing belt for connecting a pulley coupled to said motor and said pulley joined to said lead screw.

38. A wafer conveyor system as claimed in claim 33, wherein a stopper for returning said second rail to its original position is installed to said base.

39. A wafer conveyor system as claimed in claim 33, wherein said branch apparatus further comprises a rail stopper for accurately aligning said first and second rails with said main rail.

40. A wafer conveyor system as claimed in claim 39, wherein said rail stopper comprises a rectangular-shaped main body, a first support end extending from the upper portion of one side of said main body for supporting said first rail, and a second support end extending from the central portion of the other side of said main body for supporting said second rail.

41. A wafer conveyor system comprising:
a stocker for storing and delivering a package box with a plurality of wafers therein;
a transferring path for connecting one stocker with another stocker;
a carrier traveling along said transferring path for transporting said package box between said stockers;
an automatic charging device placed to any one position of said transferring path for charging a battery loaded onto said carrier traveling along said transferring path when said battery is discharged; and
a central control unit for controlling the driving of said stocker, transferring path, carrier and automatic charging device, and
wherein said carrier comprises:
a driving section having driving means onto the front of a table loaded with said package box thereon;
a charging section equipped with said battery for supplying electric power to said driving means at a rear portion thereof; and
control means for controlling the driving of said driving means, and
wherein said driving section comprises a main roller rotated by receiving said motive power from said driving means; and said charging section is installed with an auxiliary roller rotated in association with said main roller.

42. A wafer conveyor system as claimed in claim 41, further comprising a balance keeping roller erectly installed to both sides of said main roller and auxiliary roller for keeping the balance between said driving section and charging section while rotating along said main rail, and a guide roller installed to the front of said main roller and auxiliary roller for inducing said driving section and charging section into the curvature direction when being rotated along the curved rail.

43. A wafer conveyor system as claimed in claim 41, wherein said control means comprises:
communicating means for exchanging information about said package box put on said table and information about the moving position of said driving section with said central control unit;
a charge inspecting device for sensing the charging amount of said battery internally included in said charging section;
a position sensor for controlling the moving operation of said driving section; and
a front sensor for sensing a frontal obstruct.

44. A wafer conveyor system as claimed in claim 43, wherein said communicating means comprises:
a board for storing information;
an infrared ray emitting device for converting said information of said board into infrared rays to transmit the result to an external terminal;
an infrared ray emitting device holder for supporting aid infrared ray emitting device; and
an infrared ray emitting device pusher for connecting said infrared ray emitting device holder to said central control unit.

* * * * *

UNITED STATES PATENT AND TRADEMARK OFFICE
CERTIFICATE OF CORRECTION

PATENT NO. : 5,955,857
DATED : September 21, 1999
INVENTOR(S) : Kwon et al

It is certified that error appears in the above-identified patent and that said Letters Patent is hereby corrected as shown below:

On title page, item [56] (References Cited), prior to line 16, please insert:
--5,220,263   6/1993  Onishi et al . . . . . . . 318/587--.

At col. 10, line 59, please cancel "10c" and substitute therefor --100c--.

At col 23, line 3, please cancel "claim 31" and substitute therefor --claim 30--.

At col. 24, line 61, please cancel "aid" and substitute therefor --said--.

Signed and Sealed this

Eighth Day of August, 2000

Attest:

Attesting Officer

Q. TODD DICKINSON
Director of Patents and Trademarks